(12) United States Patent
Rummens

(10) Patent No.: US 11,881,262 B2
(45) Date of Patent: Jan. 23, 2024

(54) LOW-CONSUMPTION RRAM MEMORY DIFFERENTIAL READING

(71) Applicant: COMMISSARIAT A L'ENERGIE ATOMIQUE ET AUX ENERGIES ALTERNATIVES, Paris (FR)

(72) Inventor: Francois Rummens, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 190 days.

(21) Appl. No.: 17/557,868

(22) Filed: Dec. 21, 2021

(65) Prior Publication Data
US 2022/0238154 A1    Jul. 28, 2022

(30) Foreign Application Priority Data
Dec. 22, 2020   (FR) ...................................... 20 13879

(51) Int. Cl.
*G11C 13/00* (2006.01)

(52) U.S. Cl.
CPC .... *G11C 13/004* (2013.01); *G11C 2013/0042* (2013.01)

(58) Field of Classification Search
CPC .............................. G11C 13/004; G11C 13/00
USPC ........................................................ 365/148
See application file for complete search history.

(56) References Cited

U.S. PATENT DOCUMENTS

| | | | | |
|---|---|---|---|---|
| 5,986,960 A * | 11/1999 | Fujioka | ................... | G11C 5/147 365/189.08 |
| 6,317,359 B1 | 11/2001 | Black et al. | | |
| 2003/0198081 A1* | 10/2003 | Tanizaki | ............. | G11C 11/1673 365/171 |
| 2008/0007987 A1* | 1/2008 | Takashima | .............. | G11C 11/22 365/145 |

(Continued)

OTHER PUBLICATIONS

M.Bocquet,et al., In-Memory and Error-IImmune Differentia IRRAM Implementation of Binarized Deep Neural Networks, IEEE,2018,IEDM18-484-IEDM18-487.*

(Continued)

*Primary Examiner* — Muna A Techane
(74) *Attorney, Agent, or Firm* — Oblon, McClelland, Maier & Neustadt, L.L.P.

(57) ABSTRACT

A Resistive random access memory (ReRAM) comprising:
an array ($M_1$) of cells ($C_{ij}$) each connected to a first supply line (SL) set at a first supply potential, each cell being provided with a resistive element (1, 2) and a selection transistor ($Ms_1$, $Ms_2$),
a read circuit ($40_0$) associated with a given row of cells and comprising a sense amplifier ($44_0$) of the latch type connected to a second supply line (45) set at a second supply potential, the device further comprising:
a circuit for controlling read operations configured to during a reading:
apply to said first bit line ($BL_0$) a potential equal to said first supply potential (GND, VDD) while isolating the first bit line ($BL_0$) from said sense amplifier ($44_0$), then, couple the first bit line ($BL_0$) to said sense amplifier ($44_0$).

18 Claims, 19 Drawing Sheets

(56) References Cited

U.S. PATENT DOCUMENTS

2016/0293253 A1 10/2016 Ogiwara et al.
2019/0341107 A1* 11/2019 Bertin .................. G11C 29/021

OTHER PUBLICATIONS

T. Hirtzlin, et al., "Hybrid Analog-Digital Learning with Differential RRAM Synapses", IEEE, 2019, IEDM19-534-IEDM19-537.*
Tifenn Hirtzlin, et al., "Digital Biologically Plausible Implementation o fBinarized Neura lNetworks with Differential Hafnium Oxid eResistive Memory Arrays", arXiv:1908.04066v1[cs.ET], Aug. 12, 2019, 19 pages.*
Weisheng Zhao, et al., Synchronous Non-Volatile Logic Gate Design Based on Resistive Switching Memories, IEEE Transactions on Circuits and Systems-I:Regular Papers, vol. 61, No. 2, Feb. 2014, pp. 443-454.*
French Preliminary Search Report dated Sep. 6, 2021 in French Application 20 13879 filed on Dec. 22, 2020 (with English Translation of Categories of Cited Documents), citing documents AA-AD and AY therein, 2 pages.
M. Bocquet, et al., "In-Memory and Error-Immune Differential RRAM Implementation of Binarized Deep Neural Networks", IEEE, 2018, IEDM18-484-IEDM18-487.
Weisheng Zhao, et al., "Synchronous Non-Volatile Logic Gate Design Based on Resistive Switching Memories", IEEE Transactions on Circuits and Systems-I: Regular Papers, vol. 61, No. 2, Feb. 2014, pp. 443-454.
Per Client, U.S. Appl. No. 15/508,565, filed Jul. 11, 2019, 2017/0274119 A1, Schober, et al.
Per Client, U.S. Appl. No. 16/695,588, filed Nov. 26, 2019, 2020/0167638 A1, Rummens, et al.
Per Client, U.S. Appl. No. 16/703,465, filed Dec. 4, 2019, 2020/0202206 A1, Rummens, et al.

* cited by examiner

LOW-CONSUMPTION RRAM MEMORY DIFFERENTIAL READING

TECHNICAL FIELD

The present invention relates to the field of RRAM non-volatile resistive memories also noted ReRAM (for "Resistive Random Access Memory") and more particularly to the optimisation of operations for reading such memories.

PRIOR ART

Typically, a ReRAM memory cell is provided with at least one resistive element of which the conductance can be modified and which is likely to adopt at least two clearly distinct resistance levels: a first level, known as "HRS", of resistance known as "high" (HRS for "High Resistive State") and a second level, known as "LRS" (for "Low Resistive State") of resistance lower than the HRS level. The difference between the lowest value corresponding to a HRS level and the highest value corresponding to the LRS level, also called "memory window", is however often small. Consequently, a "differential encoding" is commonly used to code a stored binary value.

Thus, each byte of information can be encoded by constituting elementary cells formed of two resistive elements that will be, written in opposition of state, that is to say with one of the resistive elements having a HRS level and the other a LRS level, the respective resistance levels of the two resistive elements always being determined in the same order between the two elements and will be defined depending on whether it corresponds to HRS-LRS or LRS-HRS if a '0' or a '1' logic is present.

A technique for reading a stored data in such a type of memory cell is described in the document: "Hybrid Analog-Digital Learning with Differential RRAM synapses" by Bocquet et al. IEDM19-534.

It uses a read circuit provided with a sense amplifier of the latch type which, during a read operation, is coupled to the differential pair of resistive elements by means of a pair of bit lines and is provided with nodes the potentials of which toggle depending on the current values that pass through the resistive elements. Such a type of sense amplifier is produced with few transistors and operates as a high-gain current differential amplifier. It makes it possible to directly compare currents that pass through the resistive elements and circulate via bit lines.

The read circuit equipped with such an amplifier is compact, makes it possible to rapidly determine the stored data and does not induce static consumption. However, the problem arises of the dynamic consumption induced by the read operation.

During such an operation, the nodes of a cell connected to the bit lines discharge by passing typically from a pre-charge value corresponding to a supply voltage VDD to a reference voltage GND or vice versa. This discharge depends on the capacitance of the bit lines which is significant and results in a high consumption.

More generally, the problem arises of producing a new ReRAM memory device of which the implementation of read operations is improved.

DESCRIPTION OF THE INVENTION

According to an aspect, the present application relates to a resistive random access memory (ReRAM) device comprising:
an array of memory cells each connected to a first supply line set at a first supply potential, each cell of said array being provided with at least one first resistive element of variable resistivity and in series with at least one first selection transistor,
a read circuit associated with a column of cells of the array, the read circuit comprising:
a sense amplifier of the latch type consisting of cross-connected inverters and equipped with a first read node and a second read node, said inverters respectively forming a first branch and a second branch each connected on one side to a second supply line set at a second supply potential, different from said first supply potential,
at least one first coupling transistor connecting another side of said first branch to a first bit line coupled to the first respective resistive elements of the cells of said column,
at least one second coupling transistor connecting another side of said second branch either to a second bit line coupled to the second resistive elements of the cells of said column, or to the reference line delivering a reference current;
a circuit for controlling read operations on the array by way of signals for controlling switch elements, said control circuit being configured to, during a read operation carried out on a given cell of said column:
according to a waiting phase, couple said first bit line to the first supply line or charge said first bit line to a potential equal or close or substantially equal to said first supply potential, then,
according to a reset phase of said sense amplifier, by way of at least one reset transistor connect the first node and the second node in order to equalise the potentials of the first read node and of the second read node;
according to a partial discharge phase, connect the first bit line to the second supply line and, in the case where the device includes a second bit line, connect the second bit line to the second supply line, the reset phase being triggered during the partial discharge phase; then
according to a comparison phase, render conducting said first and second coupling transistors and render non-conducting or OFF said at least one reset transistor is rendered non-conducting.

During the partial discharge phase said first bit line or said bit lines may thus be partially discharged and at the terminals of the cells of said column a non-zero difference of potential is obtained while being lower, and in particular much lower, than a difference of potentials between the first supply potential and said second supply potential.

As opposed to a conventional device where a bit line charge/discharge is carried out from a supply potential VDD to a reference potential GND or vice versa, it is made sure here during the read operation to reduce the amplitude of charge or of discharge of the bit line during which makes it possible to improve the dynamic consumption.

The partial discharge phase makes it possible here to also improve the reliability of the data produced as output of the read circuit and that this output does not toggle to a decorrelated state of the resistive state of the resistive element(s) of the cell which is read accessed.

During the comparison phase, a circulation of a first current is made possible: through said first branch of said sense amplifier, the first bit line and a first resistive element of said cell and a circulation of a second current through said second branch of said sense amplifier as well as either the reference line or the second bit line and a second resistive element of said cell, until a toggling of said sense amplifier according to a difference between said first and second currents.

From said switch elements may figure at least one first switch element belonging to a reset stage of said sense amplifier, and which is controlled by way of a first control signal.

Advantageously, the control circuit is further configured to:
- during said partial discharge phase, place said first control signal in a first state, so as to maintain closed (conducting) said at least one first switch element in such a way as to interconnect the first read node and the second read node, or in such a way as to connect the first read node and the second read node to the second supply line or in such a way as to connect a first terminal and a second terminal of each of said first inverter and of the second inverter to the second supply line, then,
- during the comparison phase place the first control signal in a second state, different from said first state, so that said first switch element is open.

Said at least one first switch element may consist of, or comprise, a first reset transistor, said control circuit being configured to:
- during said reset phase, maintain conducting the first reset transistor, and
- during the comparison phase place the first control signal in a second state, different from said first state, so that said first reset transistor is non-conducting and in particular OFF.

During said reset phase the first reset transistor may be maintained conducting, so as to interconnect the first read node and the second read node, or connect the first read node to the second supply line or connect a first terminal and a second terminal of the first inverter to the second supply line.

According to a first particular embodiment, the first coupling transistor comprises or is in the form of a first isolation transistor arranged between said sense amplifier and said first bit line, the first of isolation being controlled by way of at least one second control signal, the control circuit being further configured to: during the waiting phase of the read operation prior to said partial discharge phase, place the first control signal in a first state so that said at least one switch element is closed whereas said second control signal is placed by said control circuit in a given state so as to rendered OFF the first isolation transistor and thus isolate the first bit line from said sense amplifier, the control circuit being further configured to, during said partial discharge and comparison phases: place the second control signal in another state, different from said given state, so as to render conducting the first isolation transistor and thus connect the first bit line to said sense amplifier.

Advantageously, during the waiting phase, said first control signal may be placed in a state so as to maintain conducting the first reset transistor. Thus, it is possible to implement, at the same time as the waiting phase, said reset phase of said sense amplifier.

According to a possibility of implementation, the memory cells are of the 2T-2R type and each provided with at least one other resistive element coupled to another selection transistor, the given row of cells of the array of cells then being coupled to a second bit line, the device being further provided with: a second isolation transistor between the sense amplifier and the second bit line, the first and second isolation transistors being controlled by way of said second control signal.

Advantageously, the read circuit may further comprise: a third isolation transistor and a fourth isolation transistor cross-connected so that the third isolation transistor has a first electrode coupled to the first isolation transistor and a second electrode coupled to the second isolation transistor and so that the fourth isolation transistor has a first electrode coupled to the second isolation transistor and a second electrode coupled to the first isolation transistor.

Such a configuration may make it possible for the random access memory device to carry out memory operations, in particular at least one logic operation.

The control circuit may then be further provided with: a control logic block configured to produce drive signals of the respective gates of said isolation transistors depending on at least one digital operating mode selection signal emitted over one or more inputs of said control logic block and on a volatile logic data as input of said control logic block, to select between a first operating mode of the read circuit corresponding to a read operation and at least one other operating mode of the read circuit corresponding to the implementation of at least one logic operation between at least one non-volatile data stored in the given cell of the given row of cells and the volatile logic data as input of said control logic block, said control logic block being configured to:
- when the digital selection signal has a first value corresponding to a selection of a read operation: apply drive signals of the gate of the first isolation transistor and to the gate of the second isolation transistor corresponding to the second control signal,
- when the digital selection signal has another value different from the first value and corresponding to a selection of a logic operation: transmit a first drive signal to the gate of the first isolation transistor and a second drive signal to the gate of the second isolation transistor, so as to lock one of said first and second isolation transistors while rendering conducting the other of said first and second isolation transistors.

Advantageously, the read circuit may further comprise:
a third isolation transistor and a fourth isolation transistor cross-connected, the control logic block being further configured to produce a drive signal of the respective gates of said third and fourth isolation transistors and wherein:
- when said other value is a second value corresponding to a selection of a first logic operation, in particular of the OR type or of the AND type, the logic control block is configured so as to produce a first drive signal, a second drive signal different from the first drive signal, so as to render conducting the first isolation transistor while rendering OFF the second isolation transistor,
- when said other value is a third value corresponding to a selection of a second logic operation, in particular of the AND type or of the OR type: transmit a first drive signal and a second drive signal so as to render OFF the first isolation transistor while rendering conducting the second isolation transistor,
- when the digital selection signal has a fourth value corresponding to a selection of a third logic operation, in particular of the XOR type, said logic selection block is configured so as to transmit a first drive signal to the gate of the first isolation transistor and a second drive signal to the gate of the second isolation transistor identical to the first drive signal, the third drive signal being in a state different from that of the first drive signal and of the second drive signal.

According to a possibility of implementation, the switch element of the aforementioned reset stage may comprise:
a first reset transistor coupled to the second node and to the second supply line, the first reset transistor having a gate controlled by the first control signal,
a second reset transistor coupled to the first node and to the second supply line, the second reset transistor having a gate controlled by the first control signal.

According to a variant, the switch element of the reset stage may comprise: a reset transistor having a gate controlled by the first control signal, the reset transistor being arranged between said first node and said second node.

In order to prevent a loss of information, in particular during resets of the sense amplifier, the read circuit may be further provided in order to, as output of said sense amplifier, be provided with at least one memory element, configured to, during the so-called "waiting" phase store data as output of said sense amplifier of a previous read operation.

This memory storage element may be in particular provided with:
an RS flip-flop provided with an input coupled to the first read node and with another input coupled to the second read node, or
a D flip-flop comprising an input coupled to the first read node or to the second read node.

Advantageously, the first selection transistor is controlled by a word line and provided to, when it is enabled, couple the first bit line to the first resistive element, itself being connected to the source line, the word line being maintained at a potential during the waiting phase, the discharge phase and the comparison phase of the read operation so as to maintain enabled the first selection transistor and couple the first bit line to the source line.

According to an advantageous mode, the comparator may have to receive a measured voltage from the first bit line and the control circuit may be provided with a second comparator that receives another measured voltage of the second bit line, the state of the first control signal further depending on a comparison carried out by the second comparator.

The device may further comprise at least one logic gate performing an OR logic function or an AND logic function between an output of the comparator and an output of the second comparator.

Advantageously, the device may further comprise:
at least one first so-called "repolarisation" transistor arranged between the first bit line and said first supply line, the first repolarisation transistor being configured to, depending on a repolarisation drive signal applied on its gate, alternately couple the first supply line to the first bit line and uncouple the first supply line from the first bit line. Such repolarisation transistors may make it possible to be able to sequence a plurality of operations more rapidly.

Advantageously, in particular to make it possible to protect the read circuit during write operations, the device may be provided with a first separation transistor between the first bit line and the sense amplifier. Thus, said at least one first coupling transistor may be or comprise the first separation transistor between the first bit line and the sense amplifier.

The first separation transistor being controlled by an additional control signal called "read enable signal", the control circuit being configured to place the read enable signal in a state determined during said read operation so as to render conducting the first separation transistor, and place the read enable signal in another state, different from said state determined, during a write operation on the array so as to lock the first separation transistor.

Advantageously, said at least one first coupling transistor includes a transistor with a gate dielectric thicker than the gate dielectric of transistors constituting said sense amplifier.

According to an embodiment, advantageously, during the partial discharge phase, the first bit line is connected to the second supply line by means of a first reset transistor rendered conducting by way of a first control signal, and by means of the first coupling transistor rendered conducting by way of a second control signal.

Advantageously, during the waiting phase following a comparison phase of a preceding read operation, the sense amplifier may be maintained in an OFF state after its toggling, without reset, and said first bit line recharges by a current passing through at least one selected cell of said column.

Advantageously, the reset phase is then only performed at the same time as the partial discharge phase.

From said switch elements may figure at least one switch element controlled by way of a first control signal and wherein said control circuit is further provided with a first comparator that receives a measured voltage of the first bit line, and produces as output the first control signal the state of which depends on a comparison carried out by said first comparator between said measured voltage and a predetermined reference voltage.

Said column may be coupled to a first bit line to a second bit line, and the control circuit may be provided with a second comparator that receives another measured voltage of said second bit line, the state of the first control signal further depending on a comparison carried out by said second comparator.

According to another aspect, the present application relates to a resistive random access memory (ReRAM) device comprising:
an array of memory cells each connected to a first supply line set at a first supply potential, each cell of said array being provided with at least one first resistive element of variable resistivity and in series with at least one first selection transistor,
a read circuit associated with a column of cells of the array, the read circuit comprising:
a sense amplifier of the latch type consisting of cross-connected inverters and equipped with a first read node and a second read node, said inverters respectively forming a first branch and a second branch each connected on one side to a second supply line set at a second supply potential, different from said first supply potential,
at least one first coupling transistor connecting another side of said first branch to a first bit line coupled to the first respective resistive elements of the cells of said column,
at least one second coupling transistor connecting another side of said second branch either to a second bit line coupled to the second resistive elements of the cells of said column, or to a reference line delivering a reference current;
a circuit for controlling read operations on the array by way of signals for controlling switch elements, said control circuit being configured to, during a read operation carried out on a given cell of said column:
according to a waiting phase, couple said first bit line to the first supply line or charge said first bit line to a potential equal or close or substantially equal to said first supply potential while uncoupling the first bit line from the sense amplifier or while coupling the first bit line to said sense amplifier but by maintaining the sense amplifier in a latched (toggled) state of high impedance,
then,
according to a cycle following the waiting phase and comprising a partial discharge phase then a comparison phase, couple the first bit line of said sense amplifier and maintain coupled, the first bit line to said first resistive element.

The device may further comprise:
at least one first so-called "repolarisation" transistor arranged between the first bit line and said first supply line, the first repolarisation transistor being configured to, depending on a repolarisation drive signal applied on its gate, alternately couple the first supply line to the first bit line and uncouple the first supply line from the first bit line, said first repolarisation transistor being rendered conducting in a waiting phase and non-conducting during said partial discharge and comparison phases.

The control circuit may be further configured to, according to a reset phase, typically triggered during the partial discharge, connect the first read node and the second read node so as to equalise their potentials. This may be done in particular connecting the first read node and the second node together, or by connecting the first read node and the second read node to the second supply line or by connecting a first terminal and a second terminal of each of said first and second inverters to the second supply line.

BRIEF DESCRIPTION OF THE DRAWINGS

The present invention will be better understood upon reading the description of examples of embodiment given, purely by way of indicative and non-limiting example, while referring to the appended drawings wherein.

Furthermore, in the description hereafter, terms that depend on the orientation of the device such as for example "vertical", "horizontal" are applied by considering that the device is oriented in the manner illustrated in the figures.

Identical, similar or equivalent portions of various figures bear the same numerical references such as to facilitate the change from one figure to the other.

DETAILED DESCRIPTION OF SPECIFIC EMBODIMENTS

As an introductory remark, in the present application the reference system of the "0" or "1" logic levels will be used to signify respectively, by shortcut, a low potential, for example equal to a ground gnd, and a high potential, for example equal to a supply voltage Vdd.

Figure 1:
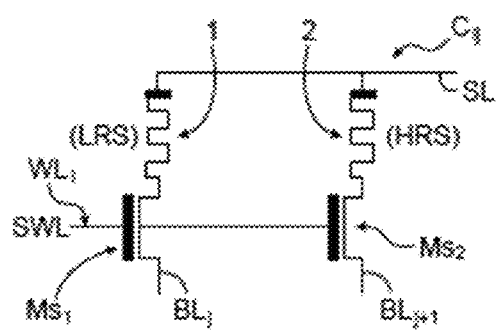
FIG. 1 is used to illustrate an elementary memory cell likely to be integrated into a ReRAM memory device in accordance with one embodiment of the present invention.

Reference is now made to FIG. 1 giving an elementary memory cell $C_{ij}$ structure likely to be integrated into a ReRAM memory device in accordance with the invention, such a device typically including an array of such cells.

The cell $C_{ij}$ is provided to keep a binary data and a conventional arrangement, with, in this example, two resistive elements 1, 2, of variable resistivity between two LRS and HRS resistivity levels, and imposed by read operations, the level imposed on the first resistive element 1, in the example illustrated noted LRS, being different from that imposed on the second resistive element 2 and which, in the example illustrated, is noted HRS. The resistive elements 1, 2 of the same cell are thus written in opposition of state.

The resistive elements 1, 2 are each equipped with an electrode coupled to a so-called "source" line SL and to another electrode coupled to a selection transistor $M_{s1}$, $M_{s2}$. According to a particular embodiment, the resistive elements 1, 2 are of the OxRAM type.

In an elementary cell, two selection transistors $M_{s1}$, $M_{s2}$, the gates of which are controlled by a signal conveyed by the same word line $WL_i$ thus make it possible, alternately to couple or uncouple the resistive elements 1, 2, respectively to/from a first bit line $BL_j$ and to/from a second bit line $BL_{j+1}$. The term "coupled" is used throughout the present application to designate a direct electrical connection or a connection established via one or more intermediate components (resistance(s), transistor(s), etc.).

In this example, the elementary cells are thus of the "2T-2R" type with two resistive elements 1, 2 and two selection transistors $M_{s1}$, $M_{s2}$ per cell.

Figure 2:
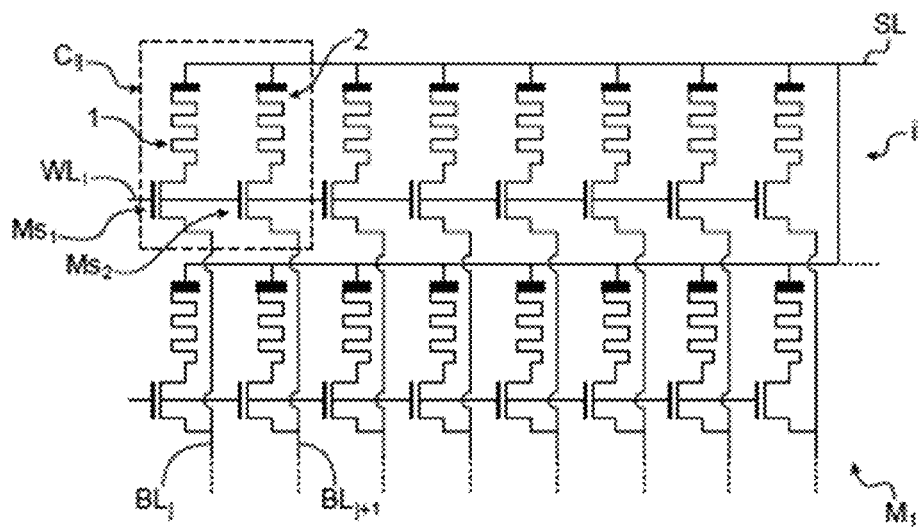
FIG. 2 an array of memory cells within a ReRAM memory device in accordance with one embodiment of the present invention.

In an array $M_1$ of cells, a partial view of which is given by way of example in FIG. 2, the same first supply line called source line SL is typically shared by all of the cells, whereas the cells of the same horizontal row i, in other words the same line of cells, share the same word line $WL_i$ and the cells of the same vertical row j, in other words a column of cells, share the same pair of bit lines $BL_j$, $BL_{j+1}$.

It will be noted that the array of memory cells may be accessed in read or in write (including the useful erasure for some resistive memory technologies). In the present invention the read mode is more particularly of interest. In read mode, the source line SL is in the examples described permanently connected to the same supply potential. In the example being described, this supply potential is "high", here equal to VDD.

During a write mode, the source line SL may for example be connected to the ground GND by a source line driver 10.

Figure 3:
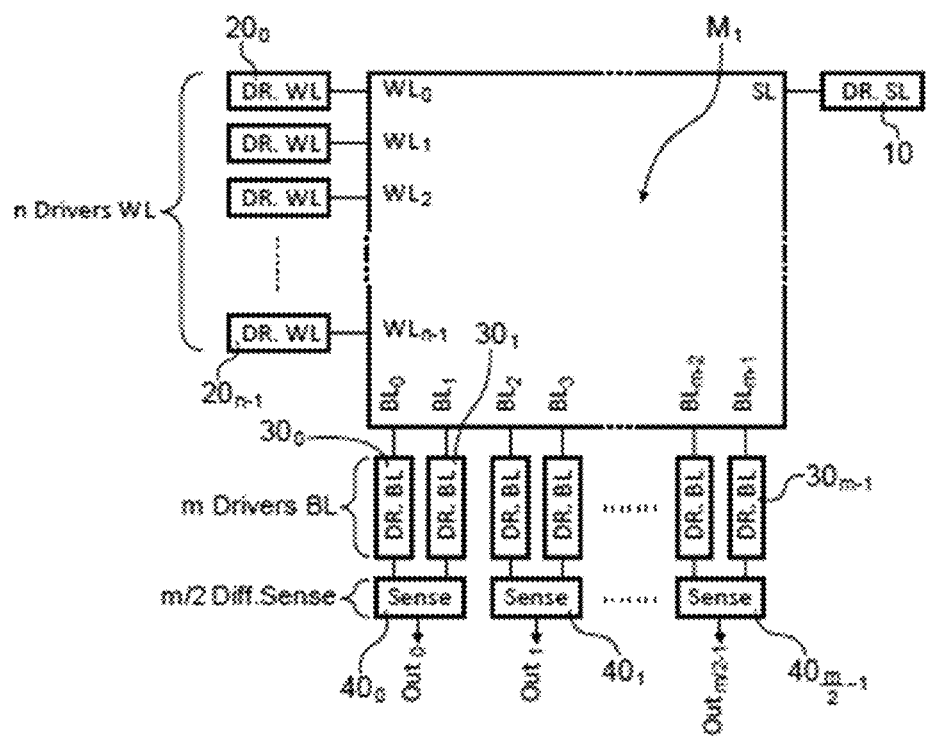
FIG. 3 is used to illustrate control elements peripheral to an array plane of a ReRAM memory device in accordance with the invention.

The array $M_1$ is also associated, as illustrated in FIG. 3, with word line drivers, for example one per line of the array $M_1$, so that for an array of n lines, the memory device includes n word line drivers $20_0, \ldots, 20_{n-1}$.

The memory device is also typically provided with bit line drivers, for example one driver $30_0, \ldots, 30_{m-1}$ per bit line, so that for an array of m/2 columns of cells and two bit lines per column, the memory device includes m bit line drivers $30_0, \ldots, 30_{m-1}$, each making it possible to select the cells of the same column of cells.

Around the periphery of the array, and in particular at the base of each pair of columns, a read circuit $40_0, \ldots, 40_{m/2-1}$ is provided to make it possible to translate into a binary data on the respective output $OUT_0, \ldots, OUT_{m/2-1}$ from such a read circuit the resistive states of the resistive elements 1, 2 of a ReRAM memory cell which is read accessed.

In order to improve the read operations, and in particular to reduce the dynamic consumption during read operations, the read circuits $40_0, 40_1, \ldots, 40_{m/2-1}$ each coupled to a pair $BL_0$-$BL_1, \ldots, BL_{m-2}$-$BL_{m-1}$ of bit lines are here provided with a particular arrangement.

Figure 4:
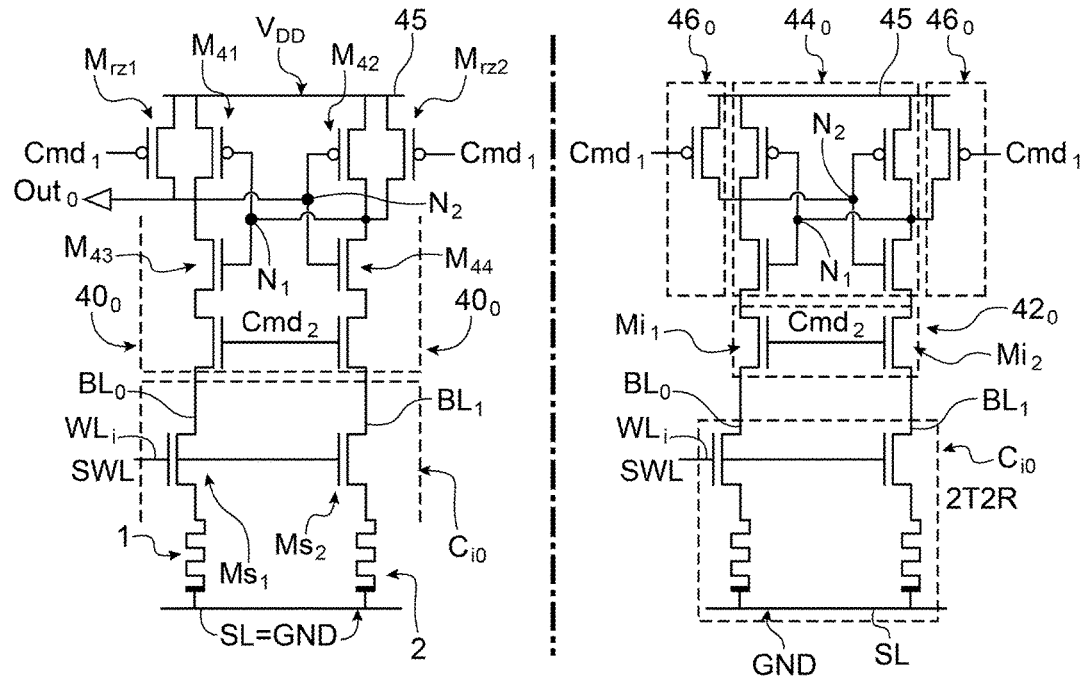
FIG. 4 is used to illustrate a circuit for reading data stored in a ReRAM cell and such as implemented in accordance with one embodiment of the present invention.

An example of embodiment of a read circuit $40_0$ is given in FIG. 4, here coupled to a cell $C_{i0}$ of a pair of columns with which this read circuit $40_0$ is associated, and of which here it is desired to read the stored binary data. The read circuit $40_0$ is moreover able to read the respective binary data of cells belonging to the same pair of columns as the cell $C_{i0}$. In this example of embodiment the cell $C_{i0}$ is coupled to a source line SL in other words a supply line, here set at a low potential for example equal to the reference potential or ground GND.

The read circuit $40_0$ is provided with a stage $44_0$ forming a sense amplifier also called read amplifier, of the latch type.

The sense amplifier $44_0$ is here provided with transistors $M_{41}$, $M_{43}$ forming a first inverter and with transistors $M_{42}$, $M_{44}$ forming a second inverter, the first inverter and the second inverter being cross-connected i.e. with an input of the first inverter corresponding to the output of the second inverter and the output of the second inverter corresponding to the input of the first inverter. The sense amplifier $44_0$ is thus provided with a first read node $N_1$ connecting the input of the first inverter and the output of the second inverter, whereas a second read node $N_2$ connects the input of the second inverter and the output of the first inverter.

The sense amplifier $44_0$ is further connected to a second supply line 45 set at a potential different from that of the first supply line or source line SL. Typically, the second supply line 45 is set at a high potential when the first corresponding supply line or source line SL is set at a low potential and vice versa. In the particular example of embodiment illustrated the second supply line 45 is set at a high potential corresponding to the supply voltage VDD.

Each inverter of the sense amplifier $40_0$ constitutes a branch connected on the one hand to the second supply line and on the other hand to a bit line, the first and second inverters thus constitute first and second branches respectively connected to the bit lines $BL_0$ and $BL_1$.

When a read operation is carried out on the cell $C_{i0}$, the difference of resistance between the resistive element 1, and the resistive element 2 results in a current imbalance between the two branches of the amplifier $44_0$ each connected to one of these resistive elements, and between two respective read nodes $N_1$, $N_2$ of these branches. If the two nodes N1 and N2 are both initially at the same potential, for example equal to the second supply line 45, the consequence of this imbalance is that the threshold voltage of one of the transistors $M_{41}$ or $M_{42}$, connected to the branch with the highest resistance, is reached more rapidly. In this example, where the transistors $M_{41}$, $M_{42}$, are of the PMOS type and connected to the supply voltage VDD, this results in setting at VDD the node N1 or N2 of the branch connected to the HRS resistance, and the other node N2 or N1 of the other branch has a potential substantially equal to that of the bit line connected to this other branch.

The read amplifier has consequently "toggled" into a state that self-services so long as the read nodes $N_1$, $N_2$ are not reset. The respective potential of the read nodes $N_1$, $N_2$ is frozen and it is said that the sense amplifier $44_0$ is in a latch state.

In the particular example of embodiment illustrated in FIG. 4, the output $OUT_0$ at the second read node $N_2$ of the sense amplifier $44_0$ is taken.

The sense amplifier $44_0$ is associated with a reset stage $46_0$ of the read nodes $N_1$, $N_2$. This stage $46_0$ is equipped with at least one first switch element, in this example in the form of two reset transistors $Mrz_1$, $Mrz_2$ also called reset-to-zero transistors, particularly provided to make it possible to reset the read nodes, at the same potential and thus remove the sense amplifier $44_0$ from its latched state.

Each reset transistor $Mrz_1$, $Mrz_2$ thus makes it possible alternately, depending on the OFF or conducting state wherein it may be placed by way of a first control signal $Cmd_1$ common and applied on the gate of two transistors $Mrz_1$, $Mrz_2$, to isolate or connect the nodes $N_1$, $N_2$ from/to the second supply line 45, in this particular example of embodiment a supply line set at a "high" potential, here corresponding to the supply potential VDD.

The state of this first control signal $Cmd_1$ also has to be modified during a read operation carried out on the cell $C_{i0}$.

The read circuit $40_0$ has here the specific feature of including a so-called "isolation" stage $42_0$ between the pair of bit lines $BL_0$, $BL_1$ and the stage $44_0$ forming the latch sense amplifier.

The isolation stage $42_0$ includes in this example two isolation transistors $Mi_1$, $Mi_2$, a first isolation transistor $Mi_1$ being disposed between the sense amplifier $44_0$ and a first bit line $BL_0$, a second isolation transistor $Mi_2$ being disposed between the sense amplifier $44_0$ and a second bit line $BL_1$.

The isolation transistors $Mi_1$, $Mi_2$ thus make it possible alternately, depending on their OFF or conducting state, controlled by a second control signal $Cmd_2$ applied on their gate, to isolate the bit lines $BL_0$, $BL_1$ from the sense amplifier $44_0$ or to connect the bit lines $BL_0$, $BL_1$ to the sense amplifier $44_0$. The state of the second control signal $Cmd_2$ is itself controlled by a circuit for controlling the read circuit and has to be modified during a read operation carried out on the cell $C_{i0}$, in order to modify the conduction state of the isolation transistors $Mi_1$, $Mi_2$ during this read operation. The isolation transistors thus have here a function of coupling transistors for alternately coupling and uncoupling the circuit for reading elements located upstream.

An example of read operation performed with the aid of such a read circuit $40_0$ will now be given in connection with FIGS. 5A-5B.

The read operation is performed in this example in two phases and typically includes a waiting phase and a comparison phase.

During a "waiting phase", (FIG. 5A), the potentials at the nodes $N_1$, $N_2$ of the amplifier $44_0$ are reset and thus set, or pre-charged, at the same value. For this, the first control signal $Cmd_1$ common to the first reset transistor $Mrz_1$ and to the second reset transistor $Mrz_2$, is placed, in this example where the transistors $Mrz_1$, $Mrz_2$ are of the PMOS type, in a state corresponding to a '0', so as to render conducting the transistors $Mrz_1$, $Mrz_2$, and connect the nodes $N_1$, $N_2$ to the same potential, here a supply potential equal to VDD.

During this waiting phase, the selection transistors $Ms_1$, $Ms_2$ are enabled by way of a word line $WL_i$ placed for example in a state '1', in particular when they are of the NMOS type.

The control signal $Cmd_2$ of the first isolation transistor $Mi_1$ and of the second isolation transistor $Mi_2$, is placed in a state, in this example where the isolation transistors $Mi_1$, $Mi_2$ are of the NMOS type corresponding to a logic level '0', so as to render OFF the transistors $Mi_1$, $Mi_2$. The bit lines $BL_0$, $BL_1$ are thus disconnected and isolated from the sense amplifier $44_0$. During this step, a discharge of the bit lines $BL_0$, $BL_1$ is thus prevented that are then connected to the same first potential, here equal to the ground GND in other words to a potential equal or substantially equal to that of the source line SL. In this example of embodiment rather than a specific pre-charge circuit, it is the source line SL that makes it possible to impose the first potential GND on the bit lines $BL_0$, $BL_1$.

It will be noted that by convention, pre-charge of a bit line refers to the operation consisting of maintaining or bringing a bit line to a potential substantially equal to that present on the first supply line, in other words that present on the source line. Subsequently, discharge of a bit line refers to an operation consisting of moving its potential away from its pre-charge level, by moving it closer to the potential present on the second supply line. Thus in the examples of FIGS. 5A and 5B, reference will be made to pre-charge of a bit line when the voltage of the bit line is maintained or moved closer to the GND voltage and reference will be made to discharge when the potential of the bit line will be raised to the Vdd voltage. For other "inversed" examples of embodiments, for which the source line is at Vdd, the convention will therefore be opposite.

After the waiting phase, during a so-called "comparison" phase (FIG. 5B), the first control signal $Cmd_1$ common to the first reset transistor $Mrz_1$ and to the second reset transistor $Mrz_2$, is placed in a state, different from that of the preceding waiting and reset phase, corresponding to '1' in this example, so as to lock the transistors $Mrz_1$, $Mrz_2$, and thus disconnect the read nodes $N_1$, $N_2$ from the supply line 45 so that they can adopt different respective potentials.

During this comparison phase, the selection transistors $Ms_1$, $Ms_2$ are always enabled by way of a word line $WL_i$ that is in the state corresponding here to a '1' logic. During the comparison phase, the control signal $Cmd_2$ of the first isolation transistor $Mi_1$ and of the second isolation transistor $Mi_2$, is for its part placed in a state different from that of the waiting phase. In this example, where the isolation transistors $Mi_1$, $Mi_2$ are of the NMOS type, a signal $Cmd_2$='1' is applied, so as to render conducting the isolation transistors $Mi_1$, $Mi_2$. The bit lines $BL_0$, $BL_1$ are thus connected to the sense amplifier $44_0$. When the isolation transistors $Mi_1$, $Mi_2$ are placed in conduction, each branch of the amplifier 440 is connected to a resistance of the cell $C_{i0}$. A current is established in each of the branches until the amplifier latches. The latching being relatively rapid, the bit lines $BL_0$, $BL_1$ discharge very little and their potential remains close to the ground GND in this example.

As opposed to an operation of devices of the aforementioned prior art for which the bit lines undergo an almost integral discharge during the comparison operation here a full-scale discharge-charge of the bit lines between the ground GND and the supply voltage Vdd is prevented. Such an operating mode thus makes it possible to reduce the amplitude of the charge-discharge of the bit lines $BL_0$, $BL_1$ and thus improve the dynamic consumption of the reading, this consumption then being mainly due to that of the sense amplifier. This advantage is related to the fact that the pre-charge level of the bit lines corresponds to the voltage level applied to the resistive memories of the memory cells on the side opposite to the bit lines. In other words, prior to a comparison operation, the resistive memories, once the word line ($WL_i$) has been enabled, see at their terminals a relatively low voltage, which may for example correspond to a few percent, 5 to 10%, of the voltage between the two supply lines, gnd and Vdd. This voltage at the terminals of the resistive memories increases very slightly the time that the amplifier latches to stabilise and reduce once the amplifier has been latched.

It is noted, that in the example of operation that has just been described, the $Cmd_1$, $Cmd_2$ are modified concomitantly. In other words, the reset of the amplifier 440 is interrupted at the moment where the branches of the amplifier are connected to the bit lines. In practice, this operating mode may induce possible read errors if the bit lines have a high capacitance because it may transpire that the amplifier latches on discharge currents of the respective capacitances of the bit lines, and not on the resistance levels of the resistive memories. A solution to this problem is given infra. With an operating mode as described above, the polarisation of the word line $WL_i$ between the waiting phase and the comparison phase is not modified. The state of a signal SWL applied on the word line $WL_i$ is only modified, and for example placed at a state '0', after completion of the comparison phase and of the read operation. The isolation transistors $Mi_1$, $Mi_2$ described above are in this example different from other transistors called "separation" transistors, and that can be used to isolate the read circuit $40_0$ during write operations carried out in the array $M_1$.

Figure 6:
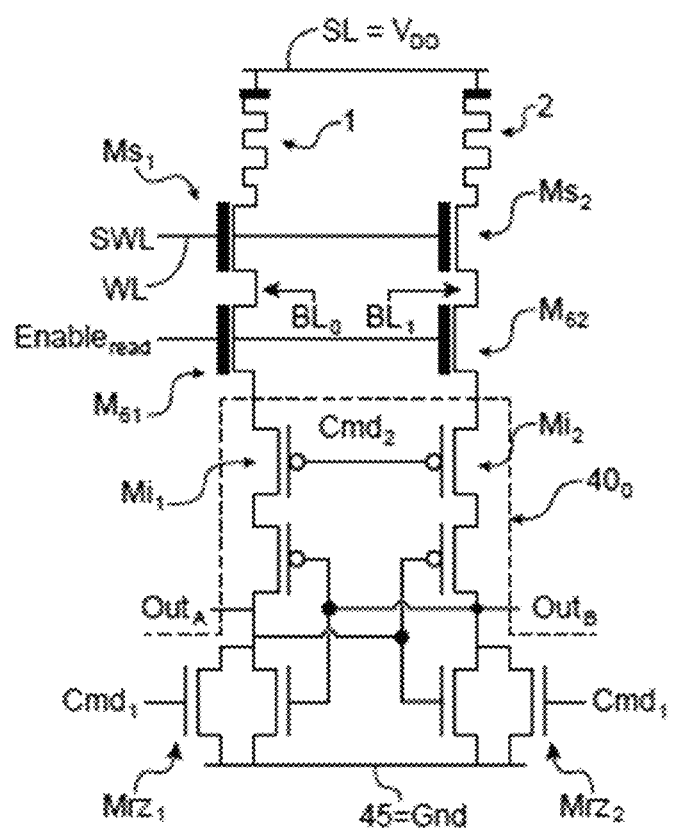
FIG. 6 is used to illustrate a read circuit such as implemented in accordance with an embodiment of the present invention and provided with separation transistors and isolation transistors disposed upstream of a latch sense amplifier.

Thus, in order to protect the transistors of the read circuit $40_0$ during write operations, it is possible to provide at the base of the column, as in the example of embodiment illustrated in FIG. 6, separation transistors $M_{61}$, $M_{62}$ arranged respectively between the first bit line $BL_0$ and the first isolation transistor $Mi_1$ and between the second bit line $BL_1$ and the second isolation transistor $Mi_2$. The conducting or OFF state of the separation transistors $M_{61}$, $M_{62}$ is controlled by way of an $Enable_{read}$ read validation signal applied on their gate. The separation transistors thus also have here a function of coupling transistors for alternately coupling and uncoupling the circuit for reading elements located upstream.

The separation transistors $M_{61}$, $M_{62}$ are enabled, in other words rendered "conducting" during read operations whereas during write operations, the separation transistors $M_{61}$, $M_{62}$ are rendered OFF in order to isolate the read circuit of the cell wherein it is written.

Typically, the separation transistors $M_{61}$, $M_{62}$ in the same way as the selection transistors $M_{s1}$, $M_{s2}$ are provided with a gate dielectric thicker than that of the transistors of the read circuit $40_0$, in order to be able to be subjected to significant voltage levels whereas the transistors of the sense amplifier and the isolation transistors $Mi_1$, $Mi_2$, are provided with a thinner gate dielectric. In practice, this makes it possible, during the reading, to prevent a loss of information in the memory cells due to possible undesired writing and further makes it possible to limit the consumption.

During a read operation, the $Enable_{read}$ read validation signal is constantly maintained in the same state, for example $Enable_{read}$='1' when the separation transistors $M_{61}$, $M_{62}$ are as in FIG. 6 of the NMOS type.

According to one variant not shown, the respective functions of isolation, by the transistors $Mi_1$, $Mi_2$, and of separation, by the transistors $M_{61}$, $M_{62}$, may be performed by the same pair of transistors. Thus, it would be possible for example to only keep the transistors $M_{61}$, $M_{62}$ and render them conducting when in read mode (as opposed to other types of operations on the array, such as the writing, the erasure of memory cells) and when, still in a read mode, it is desired to remove the isolation between the memory cell array and the differential sense amplifier $44_0$. It is particularly desired to remove the isolation function when a comparison is performed and in most embodiments described during the partial discharge phase prior to the comparison phase as is described in more details in the following examples.

FIG. 6 also makes it possible to illustrate another possibility for implementing the device, for which the source line SL is this time a supply line set at a high potential corresponding here to the supply voltage VDD when read or write operations are carried out, whereas the sense amplifier $40_0$ is here connected to a supply line 45, set at a low potential, lower than the high potential and that corresponds here to the reference potential GND. For this variant, the reset transistors $Mrz_1$, $Mrz_2$ are this time of the NMOS type, whereas the isolation transistors $Mi_1$, $Mi_2$ are of the PMOS type.

The high capacitance of the bit lines $BL_0$, $BL_1$ may pose a problem, in particular when the control signal $Cmd_2$ of the isolation transistors $Mi_1$, $Mi_2$ is modified and the bit lines $BL_0$, $BL_1$ are connected to the sense amplifier $44_0$. From this connection may indeed optionally and in some cases result a discharge of the bit lines $BL_0$, $BL_1$ towards the sense amplifier $44_0$ which is not systematically correlated with the respective states of the resistive elements of the cell that it is desired to read and that may tend to toggle the output of the sense amplifier $44_0$ without this output being representative of the binary data stored in memory of the read data.

To overcome this problem and improve the read reliability, a solution may consist of implementing different sequences between the sequence of the control signal $Cmd_2$ of the isolation transistors $Mi_1$, $Mi_2$ and the sequence of the control signal $Cmd_1$ of the reset transistors $Mrz_1$, $Mrz_2$.

Figure 7A:
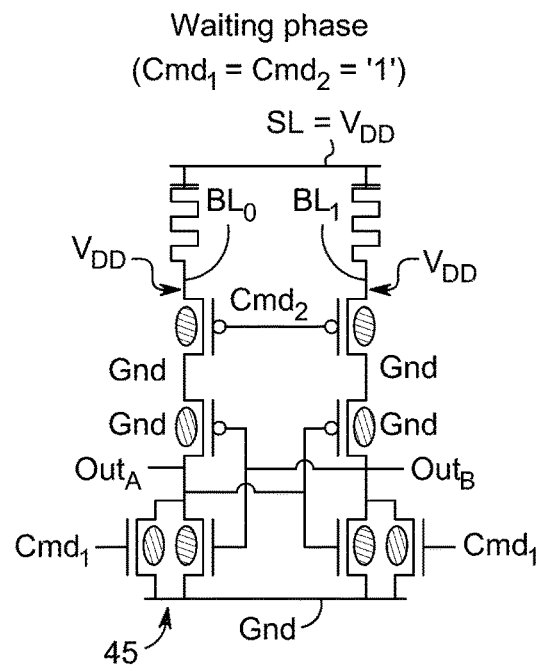
FIGS. 7A, 7B, 7C are used to respectively illustrate a waiting phase, a partial discharge phase and a comparison phase performed by a read circuit in accordance with an embodiment of the present invention for the implementation of an operation for reading a ReRAM cell.
Figure 7B:
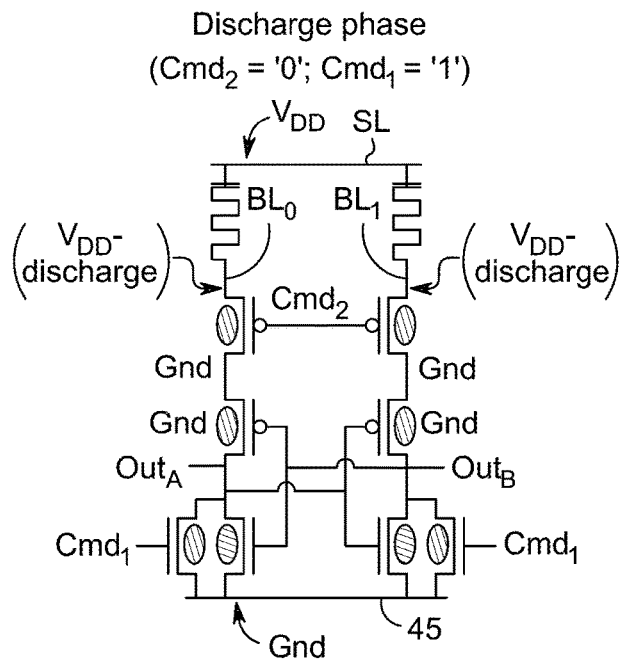
Figure 7C:
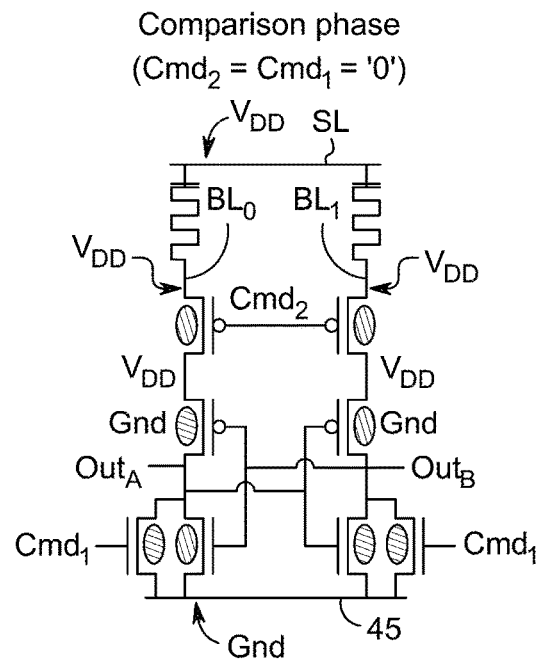

A read operation in accordance with this variant is illustrated in FIGS. 7A-7C. The preliminary waiting phase (illustrated in FIG. 7A) is similar to that described above, with a control signal $Cmd_2$, for disconnecting, or in other words isolating, the bit lines $BL_0$, $BL_i$ in relation to the read circuit $40_0$. The signal Cmd2 is then in a state '1' in order to place the isolation transistors $Mi_1$, $Mi_2$, in this example of the PMOS type, in an OFF state. A pre-charge of its bit lines $BL_0$, $BL_1$ at a potential equal or substantially equal to that of the source line SL is then performed, either by means of resistive elements as described above, or by other devices detailed infra.

Likewise, to make it possible to reset the sense amplifier $44_0$ the read nodes $N_1$, $N_2$ are set at the same potential here corresponding to the ground GND. Thus, in the example of embodiment illustrated in FIG. 7A, the control signal $Cmd_1$ is set at '1' in order to place the reset transistors $Mrz_1$, $Mrz_2$, in this example of the NMOS type, in a conducting state.

Subsequently, a two-phase cycle is carried out.

According to a so-called "partial discharge" phase (illustrated in FIG. 7B), the isolation transistors $Mi_1$, $Mi_2$ are enabled via the control signal $Cmd_2$ which triggers the discharge of the bit lines, whereas the reset transistors $Mrz_1$, $Mrz_2$ are maintained conducting. A discharge directed towards the ground with which the sense amplifier $44_0$ is here connected by means of the supply line 45, is performed through the reset transistors $Mrz_1$, $Mrz_2$ while maintaining the reset of the sense amplifier $44_0$ so that it does not switch in this step.

In the example of embodiment illustrated in FIG. 7B, the control signals $Cmd_1$ and $Cmd_2$ are respectively set at '1' and to '0' in order to place the isolation transistors $Mi_1$, $Mi_2$ and the reset transistors $Mrz_1$, $Mrz_2$ in a conducting state.

Then, after a relatively short time, when the parasitic discharge of the bit lines has been evacuated and the currents are finally function of the values of the resistive elements, the reset transistors $Mrz_1$, $Mrz_2$ are disabled to thus make it possible to switch the sense amplifier in accordance with the binary data contained in the 2T-2R cell selected.

It will be noted that the aim of this operation of partially discharging bit lines is to slightly discharge the output bit lines so as to make it possible to establish a minimum voltage at the terminals of the resistive elements for inducing a flow of currents in the resistances that become significant in relation to the self-discharge current of the bit lines and furthermore that make it possible to obtain relative currents in the resistive memories sufficiently different from one another to be able to pass to the following comparison step.

Thus, after the partial discharge phase the so-called "comparison" phase (illustrated in FIG. 7C) is carried out. The control signal $Cmd_2$ of the isolation transistors $Mi_1$, $Mi_2$ is maintained in a state (in the example of embodiment illustrated maintained at '0') so as to maintain conducting these transistors $Mi_1$, $Mi_2$, whereas the state of the control signal $Cmd_1$ of the reset transistors $Mrz_1$, $Mrz_2$ is modified (in the example of embodiment illustrated set at '0') so as to render OFF the reset transistors $Mrz_1$, $Mrz_2$ and thus make it possible that the read nodes $N_1$, $N_2$ may evolve towards different respective potentials.

The adjustment of the duration of the discharge phase and consequently the delay between enabling the isolation transistors and disabling the reset transistors is carried out in such a way as to optimise the energy efficiency of the read operation, particularly in such a way as to limit the partial discharge of the bit lines as a minimum.

There again, as opposed to a conventional operation, a discharge of the bit lines $BL_0$, $BL_1$ from the supply voltage of VDD to the Ground GND is not carried out. A gain in consumption is thus obtained and the read dynamic consumption is reduced.

Figure 8:
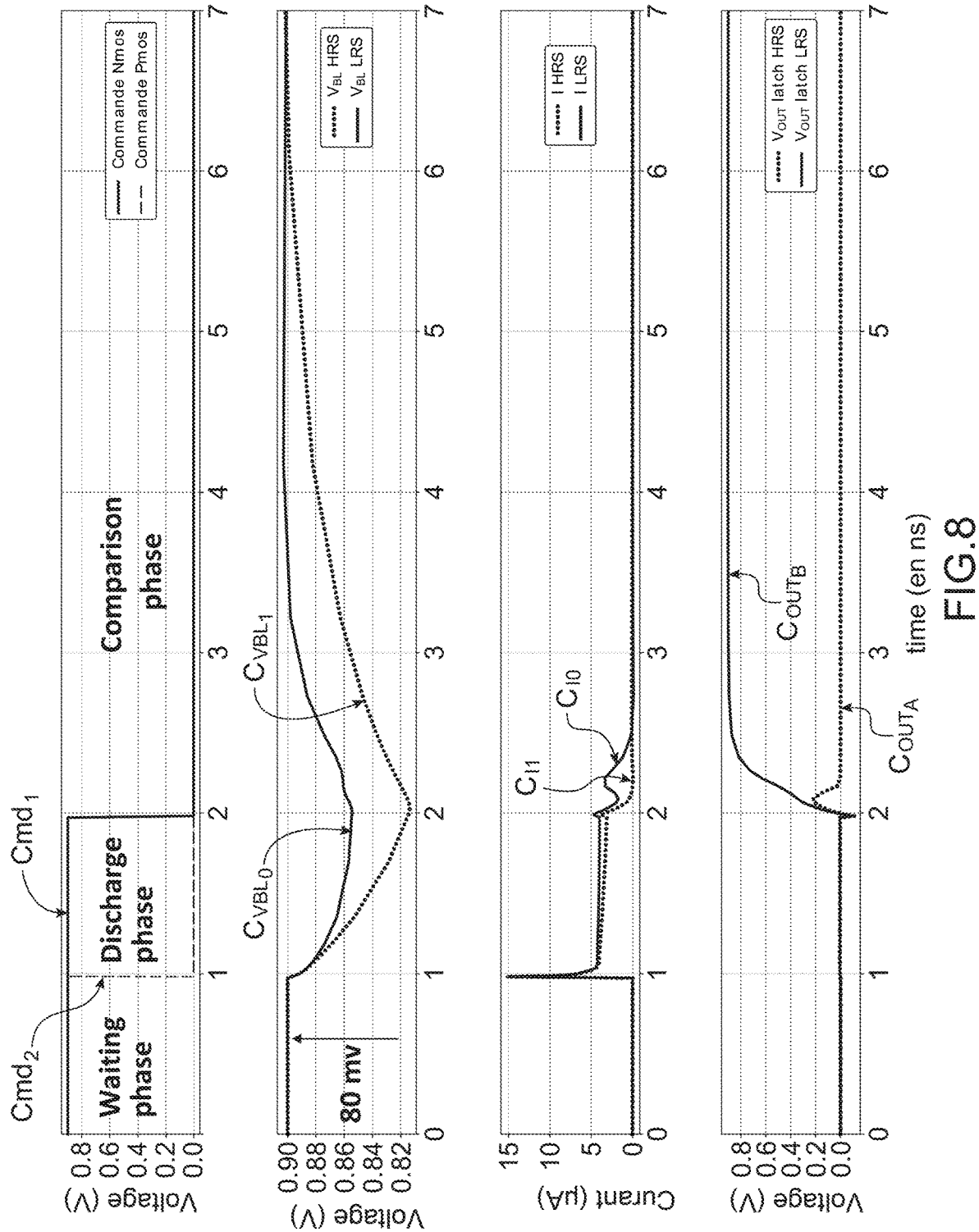
FIG. 8 is used to illustrate various signals implemented during the waiting, partial discharge and comparison phases of an operation for reading a ReRAM cell.

In FIG. 8, evolution curves of various signals called into play during a read operation simulation are given, for a memory array provided with 64 lines and consequently 64 word lines WL with, in this example, a delay between the beginning and the end of the partial discharge phase set at 1 ns, and transistors in a FDSOI (Fully Depleted Silicon On Insulator) technology of 28 nm of gate length.

The curves $C_{cmd1}$, $C_{cmd2}$ are representative respectively of the first control signal cmd1 of the reset transistors $Mrz_1$, $Mrz_2$, and of the first control signal cmd2 of the isolation transistors $Mi_1$, $Mi_2$, whereas the curves $Cv_{BL0}$, $Cv_{BL1}$ are used to illustrate respectively the voltage on the first bit line $BL_0$, in this example connected to a resistive element at the HRS level, the voltage on the second bit line $BL_1$, in this example connected to a resistive element at the LRS level. The curves $C_{IBL0}$, $C_{IBL1}$ are used to illustrate respectively the evolution of the current on the first bit line $BL_0$, and that of the current on the second bit line $BL_1$, whereas the curves CoutA, CoutB give the evolution of the respective potentials of the nodes $N_2$, $N_1$.

It may be observed that with such a delay, a partial discharge of the bit lines BL in the order of 80 mV is performed, for a full-scale discharge of 0.9 V i.e. less than 10% of the supply voltage of the circuit.

During simulation with the aid of the Monte Carlo tool, a total consumption is obtained (by taking into account the circuits for controlling bit lines and word lines WL, the charging of word lines WL, the generation of the delay) per bit/read in the order of 30 fJ. This is comparable with a SRAM of the same technology and better than the prior art of the abovementioned resistive memory-based memory circuits, by being able to divide by two, or even by three the order of magnitude of the read consumption.

Figure 9:
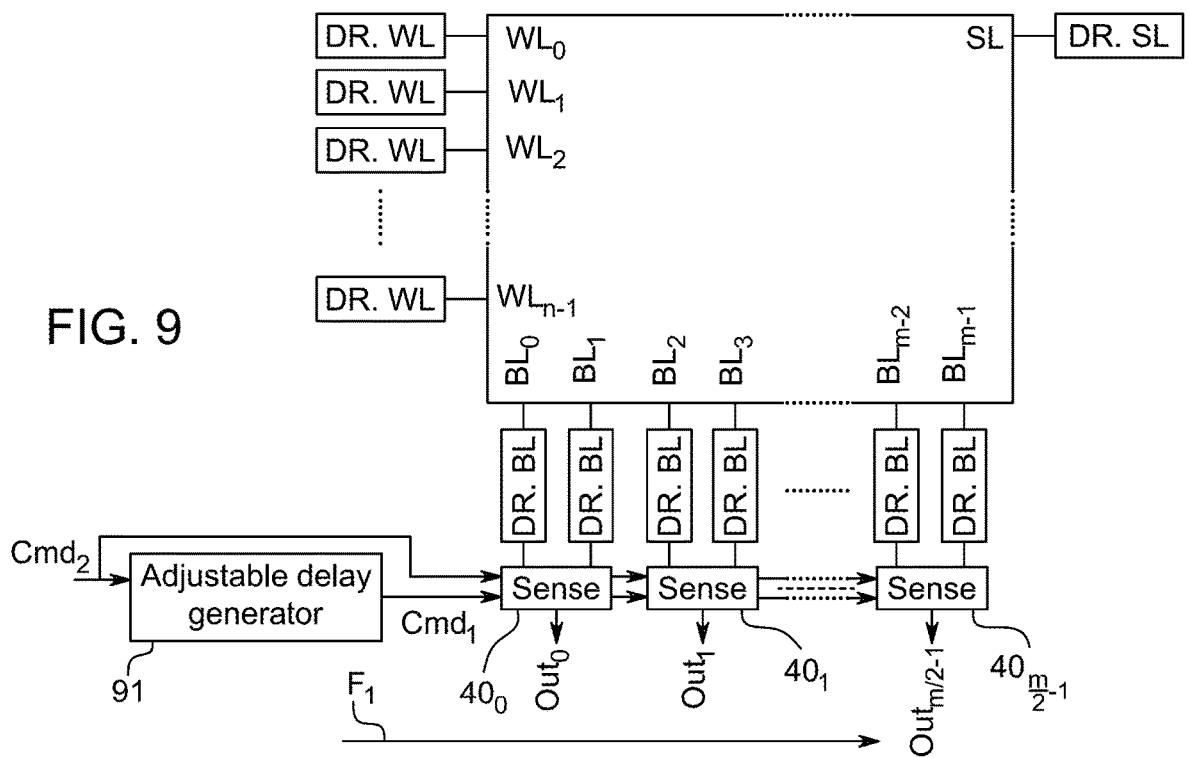
FIG. 9 is used to illustrate a particular embodiment of a control circuit of a circuit for reading ReRAM memory cells.

In the example of embodiment illustrated in FIG. 9, a control circuit for producing the control signal $Cmd_1$ of the reset stage and the control signal $Cmd_2$ of the isolation transistors $Mi_1$, $Mi_2$ is equipped with an adjustable delay generator 91 that receives as input the control signal $Cmd_2$ and produces as output the control signal $Cmd_1$ corresponding here to the signal $Cmd_2$ delayed by a predetermined delay.

The adjustable delay generator 91 may be formed for example of a succession of inverters with which a multiplexer is associated. The adjustment of the delay may be carried out by way of a configuration word, the delay being, in this case, a delay chosen from a set of delays predetermined depending on the values of the bits of the configuration word.

The control signals $Cmd_1$, $Cmd_2$ are propagated from one read circuit $40_0$ to the other $40_1$ of the plurality of read circuits $40_0, \ldots, 40_{(m/2)-1}$ located at the base of the columns and each coupled to a pair of bit lines $BL_0$, $BL_1$ (resp. $BL_2$, $BL_3 \ldots$), according to a direction of propagation typically as shown schematically by an arrow $F_1$ in FIG. 9.

According to one alternative embodiment, during a read operation, it is possible to trigger the end of the partial discharge phase depending on a comparison between a voltage level measured on at least one bit line, in particular on one or other of the bit lines $BL_0$, $BL_1$ or each of the bit lines $BL_0$, $BL_1$ coupled to a cell that it is desired to read and a predetermined reference voltage.

Figure 10:
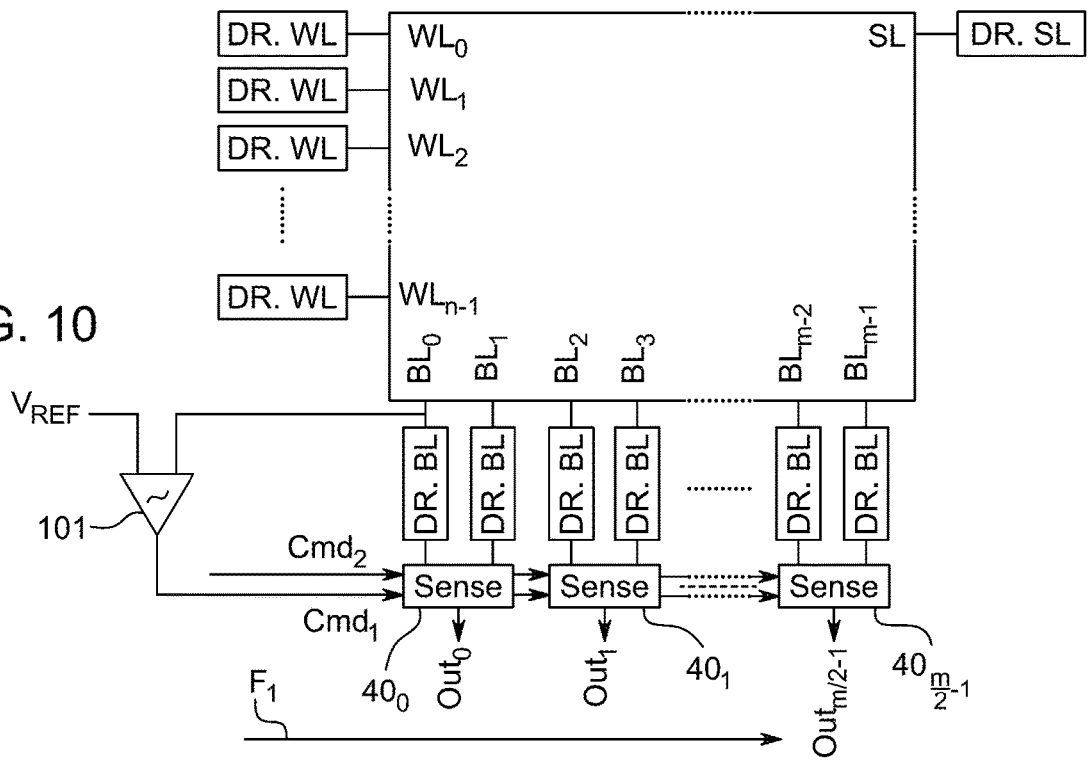
FIG. 10 is used to illustrate another particular embodiment of a control circuit for driving the sequence of control signals of a circuit for reading ReRAM memory cells such as implemented in accordance with an embodiment of the present invention.

In the particular example of embodiment illustrated in FIG. 10, it is used as measured voltage indicative of a sufficient partial discharge of the bit lines, a voltage $V_{BL0}$ of a bit line $BL_0$. When the voltage $V_{BL0}$ reaches a voltage threshold Vref, the state of the first control signal $Cmd_1$ is modified.

As seen on the simulation curves $C_{VBL0}$, $C_{VBL1}$ above, the voltages of the bit lines $BL_0$, $BL_1$ drop as the partial discharge of their capacitance progresses. This drop corresponds to a moment with the formation of a current through the resistive elements 1, 2. In the example illustrated, the lower the bit line voltage VBL is the higher the current passing through in the sense amplifier $44_0$ is representative of the resistance values of the ReRAM and therefore the more reliable the read operation is.

It is triggered in this example the change of state of the first control signal $Cmd_1$ for locking the reset transistors by using the output signal of a comparator 101 an input of which receives the voltage $V_{BL0}$ of a bit line $BL_0$. The reference voltage Vref that is used as reference may be determined by taking into account parameters of technological variability, of thermal effects, of mismatches between performances of the components.

Figure 11:
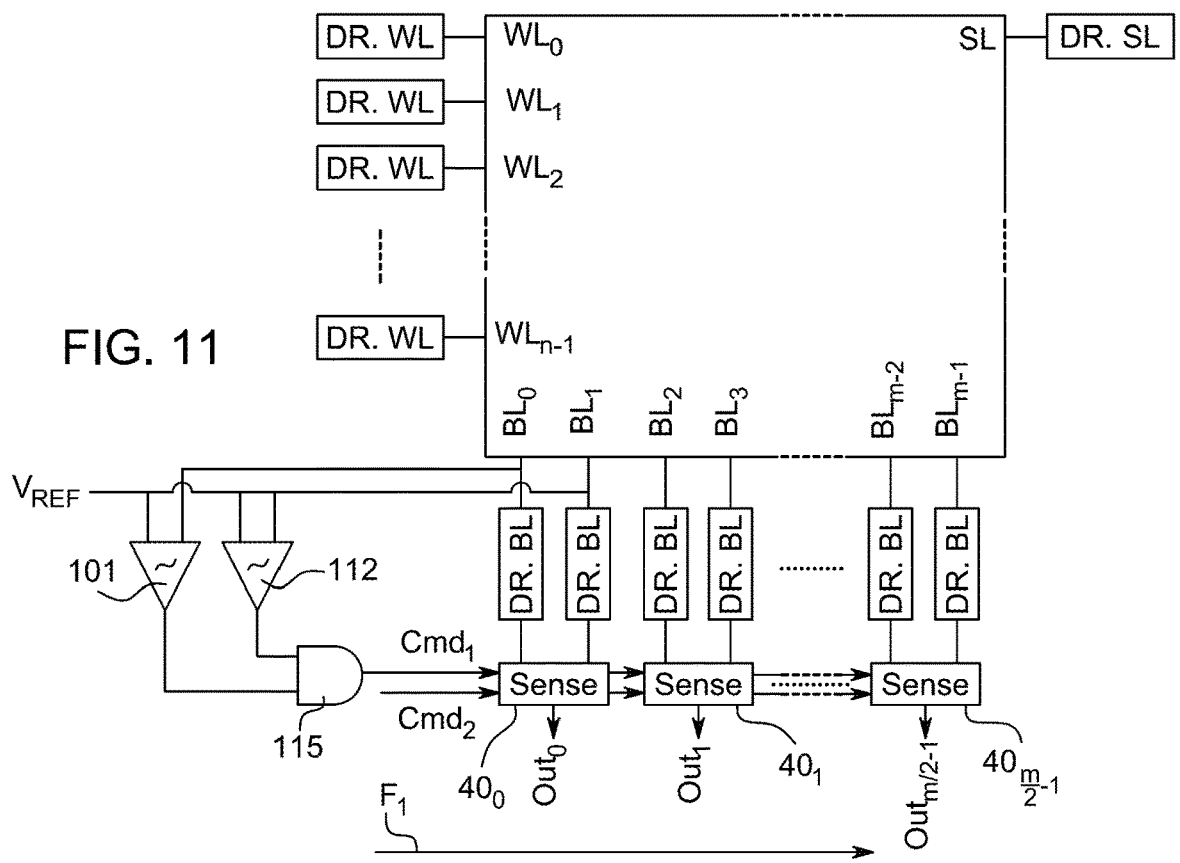
FIG. 11 is used to illustrate an alternative embodiment of the control circuit for which the sequence of control signals is adjusted according to a measurement of voltages sampled on each bit line of a pair of bit lines used to read a data stored in a ReRAM cell.

In another example of embodiment illustrated in FIG. 11, it is used as measured voltage indicative of a sufficient partial discharge of the bit lines, both a voltage $V_{BL0}$ of the first bit line $BL_0$, and a voltage $V_{BL1}$ of the second bit line $BL_2$.

It is then triggered the change of state of the control signal $Cmd_1$ of the reset stage this time by using a first comparator 101 to compare an input receiving the voltage $V_{BL0}$ of a first bit line $BL_0$ and the reference voltage $V_{ref}$, and a second comparator 112 to compare an input receiving the voltage $V_{BL1}$ of the second bit line $BL_1$ and the reference voltage $V_{ref}$. The control signal $Cmd_1$ of the reset stage may then be produced as output of a logic block, in this example a gate 115, performing an AND function between an output of the first comparator 101 and an output of the second comparator 112. The duration of the discharge phase is thus adjusted depending on the longest duration between two different discharge times.

Figure 12:
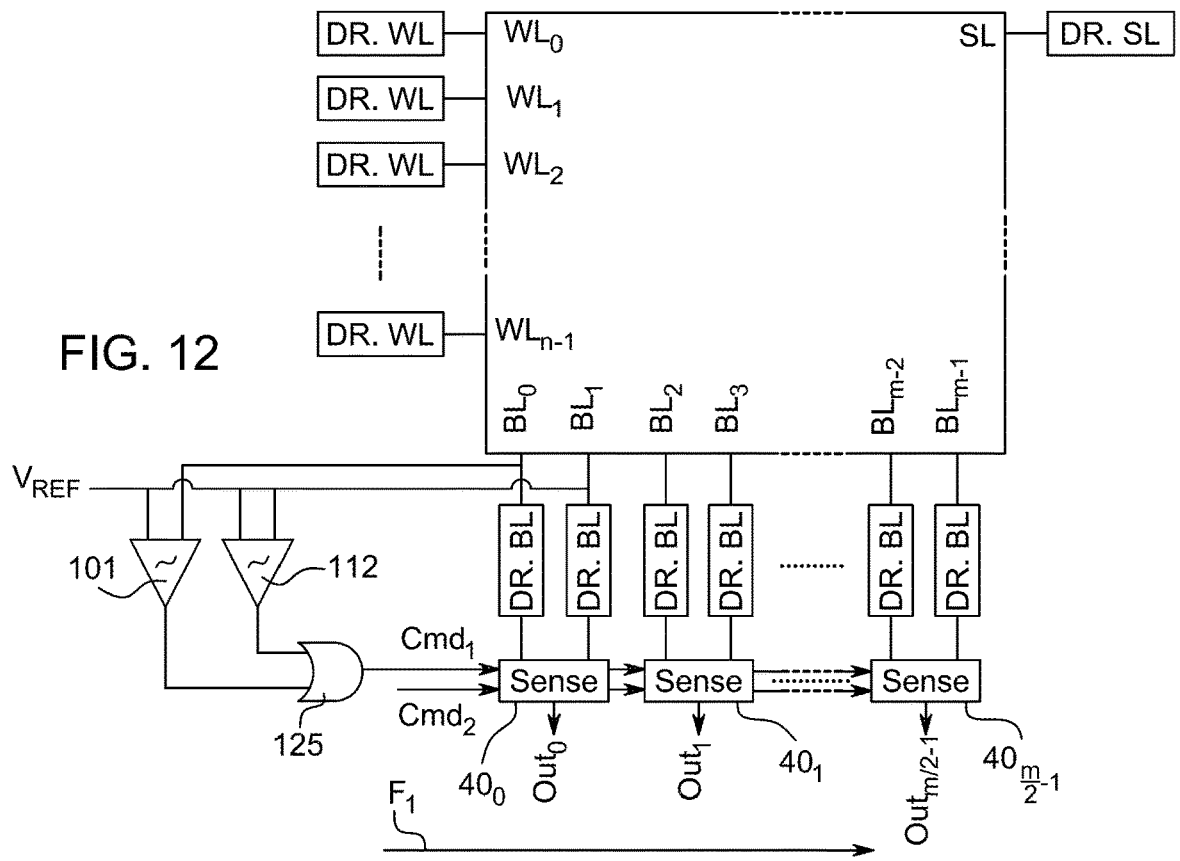
FIG. 12 is used to illustrate another alternative embodiment of the control circuit.

Alternatively, in the particular example of embodiment illustrated in FIG. 12, the output of the first comparator 101 and of the second comparator 112 are coupled respectively to an input and to another input of a logic block, in particular a logic gate 125 that, in this example, performs an OR function. For this variant, the duration of the discharge phase is therefore here rendered shorter than in the preceding example.

As a variant of one or other of the examples of embodiment described above, a reset of the nodes $N_1$, $N_2$ of the sense amplifier $44_0$ can be carried out in a different way than that described above with the reset transistors $Mrz_1$, $Mrz_2$.

Figure 13:
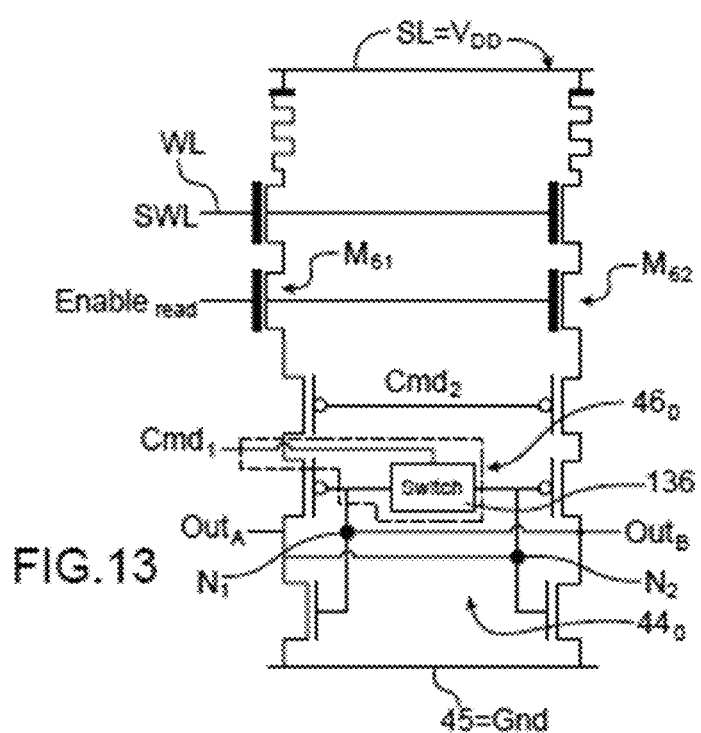
FIG. 13 is used to illustrate an alternative embodiment of the read circuit for which the reset of the sense amplifier is performed by means of a particular reset stage by interconnecting the read nodes of said amplifier.

Thus, in the example of embodiment illustrated in FIG. 13, a reset stage 460 of the sense amplifier $44_0$ is provided, this time provided with a switch element 136 disposed between the nodes $N_1$, $N_2$ of the sense amplifier $44_0$, and the state of which, open or closed, is controlled by way of the control signal $Cmd_1$.

Thus, instead of resetting the sense amplifier $44_0$, by connecting or coupling its nodes $N_1$, $N_2$ to a supply line 45 connected to the ground or to a supply potential Vdd, it is possible to short-circuit these nodes $N_1$, $N_2$ to perform this reset.

The switch element 136 is thus configured to, depending on the state of the control signal $Cmd_1$, interconnect the nodes $N_1$, $N_2$ of the sense amplifier, then disconnect from one another the nodes $N_1$, $N_2$ of the sense amplifier.

The switch element 136 may be produced in a plurality of ways depending on the technology used and on the type of transistors forming the sense amplifier. For example the switch element 136 may be produced by a CMOS transmission gate typically consisting of a NMOS transistor and of a PMOS connected in parallel. According to another example of embodiment, when the sense amplifier $44_0$ is as in FIG. 13, connected to a supply line 45 connected to the ground Gnd, the switch element 136 may be a NMOS transistor the gate of which is controlled by the first control signal $Cmd_1$.

Figure 5A:
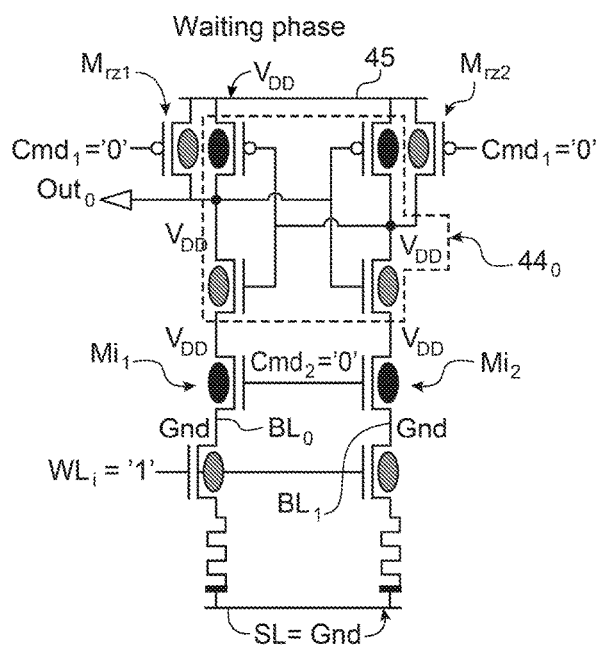
FIGS. 5A, 5B are used to respectively illustrate a waiting phase and a comparison phase for implementing an operation for reading ReRAM cells such as implemented in accordance with an embodiment of the present invention.
Figure 5B:
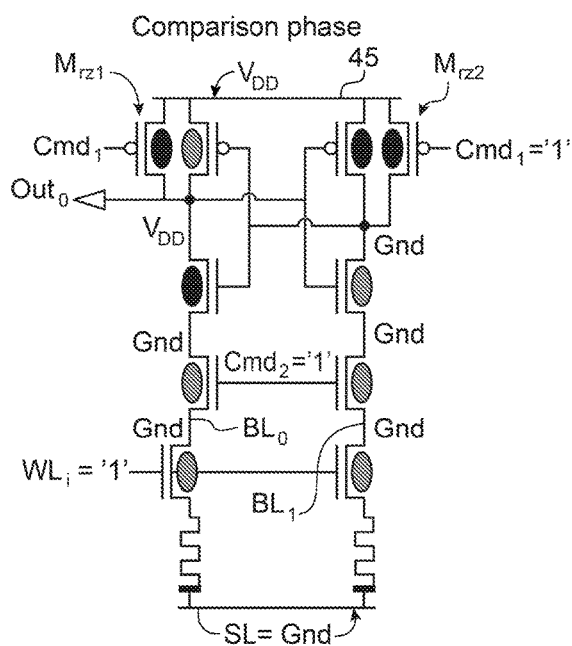

Alternatively, when the sense amplifier $44_0$ is, as in the example of embodiment illustrated in FIGS. 5A-5B, connected to the supply voltage Vdd, the switch element 136 may be in the form of a transistor of the PMOS type.

With such a reset stage, a three-phase operation as described above may be kept. Such an operation is shown in FIGS. 14A-14C illustrating a particular example of embodiment with a switch element in the form of a transistor 146, here of the NMOS type, arranged between the nodes $N_1$ and $N_2$ and able, depending on the state of the control signal $Cmd_1$ applied on its gate alternately to interconnect or connect the nodes N1 and $N_2$ and disconnect the nodes N1 and $N_2$ with/from one another.

The sense amplifier $44_0$ is in this example connected to a supply line 45 connected to the ground GND and the isolation transistors $Mi_1$, $Mi_2$ are of the PMOS type.

Figure 14A:
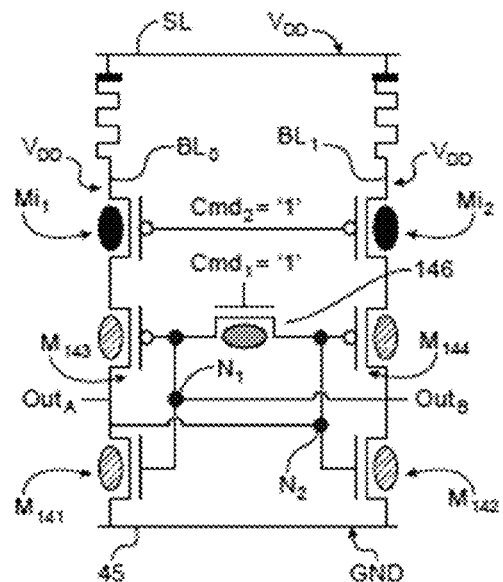
FIGS. 14A, 14B, 14C are used to illustrate various operating phases of a read circuit equipped with this particular reset stage of the sense amplifier.
Figure 14B:
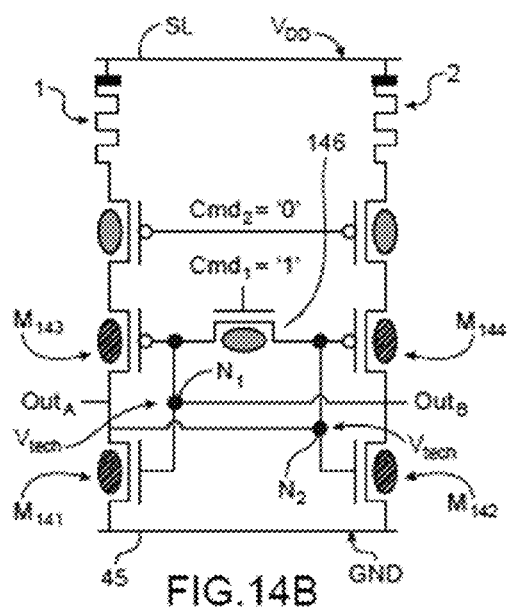
Figure 14C:
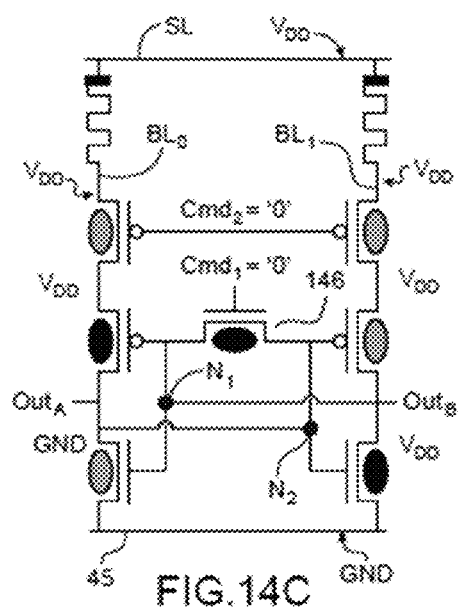

A so-called "waiting" phase is firstly carried out (FIG. 14A). During this phase, a disabling of the isolation transistors $Mi_1$, $Mi_2$ controlled by the signal $Cmd_2$, in this example set at the state '1', is carried out in order to isolate the sense amplifier $44_0$ from the bit lines $BL_0$, $BL_1$. It is imposed here at the bit lines $BL_0$, $BL_1$, a potential equal or substantially equal to the potential VDD at which in this example is the source line SL.

At the same time, the first control signal $Cmd_1$, in this example set at the state '1', makes it possible to establish the short-circuit and thus interconnect the nodes $N_1$, $N_2$ of the sense amplifier $44_0$. During the waiting phase described here, it can be noted that in this example the transistors $M_{141}$, $M_{142}$, $M_{143}$, $M_{144}$ of the sense amplifier $44_0$ are in an uncertain state, which does not hinder the operation of the read operation strictly speaking and which mainly takes place in the following steps. Subsequently (FIG. 14B), during a so-called "partial discharge" phase, the isolation transistors $Mi_1$, $Mi_2$ are enabled (second control signal $Cmd_2$, in this example set at the state '0'), which makes it possible to circulate current in the two branches of the sense amplifier $44_0$ and therefore for the potential of the nodes $N_1$, $N_2$ to evolve and here in particular to charge. The first control signal $Cmd_1$, in this example maintained at the state '1', makes it possible to maintain the short-circuit. We therefore have a sense amplifier $44_0$ supplied with current and short-circuited. The potential at the nodes $N_1$, $N_2$ will therefore stabilise at a voltage noted here $V_{tech}$ that may be typically close to $V_{DD}/2$ in other words half of the supply voltage $V_{DD}$ applied to the resistive elements 1, 2. The value of this voltage $V_{tech}$ depends on the technology used and on the relative dimensioning of the various transistors. For a voltage $V_{tech}$ close to $V_{DD}/2$, the transistors $M_{141}$, $M_{142}$, $M_{143}$, $M_{144}$ of the sense amplifier $44_0$ are all in an intermediate state.

Finally (FIG. 14C), during the subsequent comparison phase of the read cycle, the isolation transistors are maintained enabled and the switch transistor 146 is disabled which makes it possible to disconnect from one another the nodes of the sense amplifier which may then evolve towards different respective potentials. Consequently, this results in the toggling of the sense amplifier 44.

Figure 15:
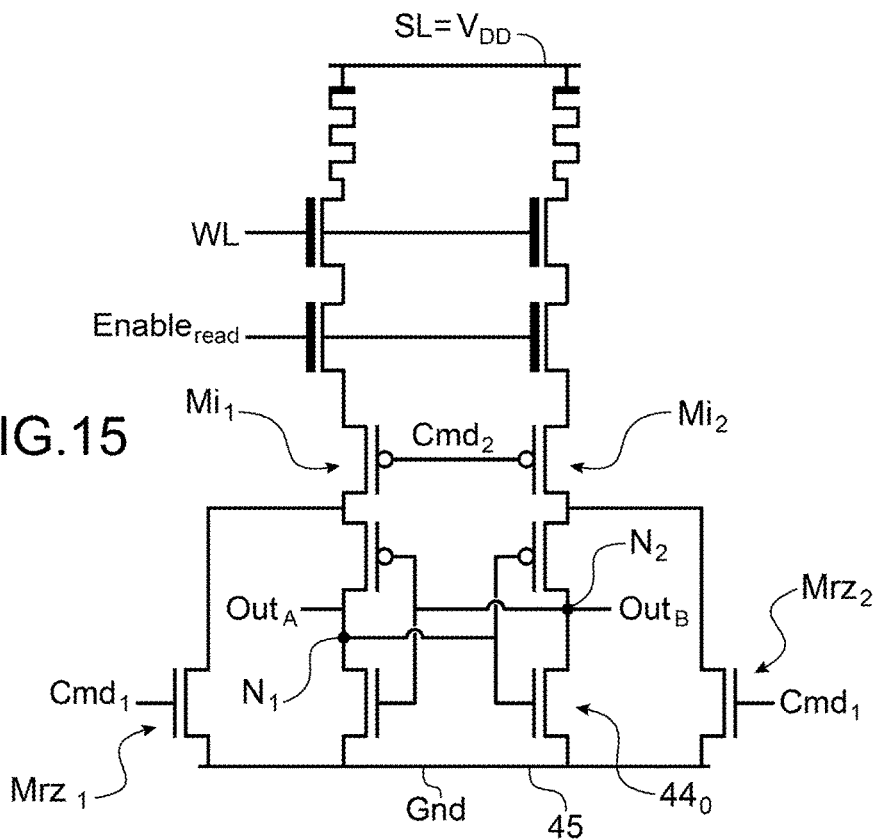
FIG. 15 is used to illustrate an alternative embodiment of a reset stage of a sense amplifier integrated into a ReRAM memory read circuit.

Another alternative embodiment less performant than that described above in connection with FIG. 6 this time provides for producing the reset stage with a different arrangement of the reset transistors $Mrz_1$, $Mrz_2$. In this example, the supply line 45 to which a first terminal of the inverters of the sense amplifier is connected is set at a low potential corresponding here to the ground Gnd, Thus, in the example illustrated in FIG. 15, the reset transistors $Mrz_1$, $Mrz_2$ the gate of which is controlled by the signal Cmd1, have an electrode connected to the supply line 45, and another electrode that, for the first reset transistor $Mrz_1$, is coupled to a second terminal of an inverter of the sense amplifier and to the first isolation transistor $Mi_1$. For the second reset transistor $Mrz_1$, the other electrode is coupled to a second terminal of another inverter of the sense amplifier and to the second isolation transistor $Mi_2$. When the signal of cmd1 is active, at '1', the two inverters are between two identical supply levels and consequently the nodes N1 and N2 discharge and take this same supply voltage value, corresponding to the ground in this example.

After a read operation, the control signals $Cmd_1$ and $Cmd_2$ are typically returned to their initial state corresponding to the waiting phase, that is to say that the first control signal $Cmd_1$ is placed in a state so as to enable (i.e. render conducting) the reset transistors whereas the second control signal $Cmd_2$ is placed in a state so as to disable (i.e. render OFF) the isolation transistors.

By carrying out this operation, particularly the reset operation, the information read during this read operation is likely to be lost. To prevent this, the read circuit may be configured to wait for the memory device to take into account the read result, for example by only carrying out the return to waiting phase following a capture of information read by a flip-flop or another block of the memory, for example the input/output block of the memory or an internal processing/computation block of the memory.

One variant of the memory device may be provided particularly if it is desired to be able to anticipate a next reading and for this enable a word line other than that enabled to carry out a reading in progress. One example of embodiment is given in FIG. 16A, with a memory storage element $120_0$ equipped with a RS flip-flop provided as output of the sense amplifier $44_0$ to make it possible to store the state of the output or outputs OutA, OutB of the sense amplifier $44_0$, even when the nodes $N_1$, $N_2$ are reset. Such an embodiment adapts to a reset of the nodes $N_1$, $N_2$ as described in connection with FIGS. 4 to 7, by setting at the same potential, in particular at the ground, with the aid of two reset transistors.

Figure 16A:
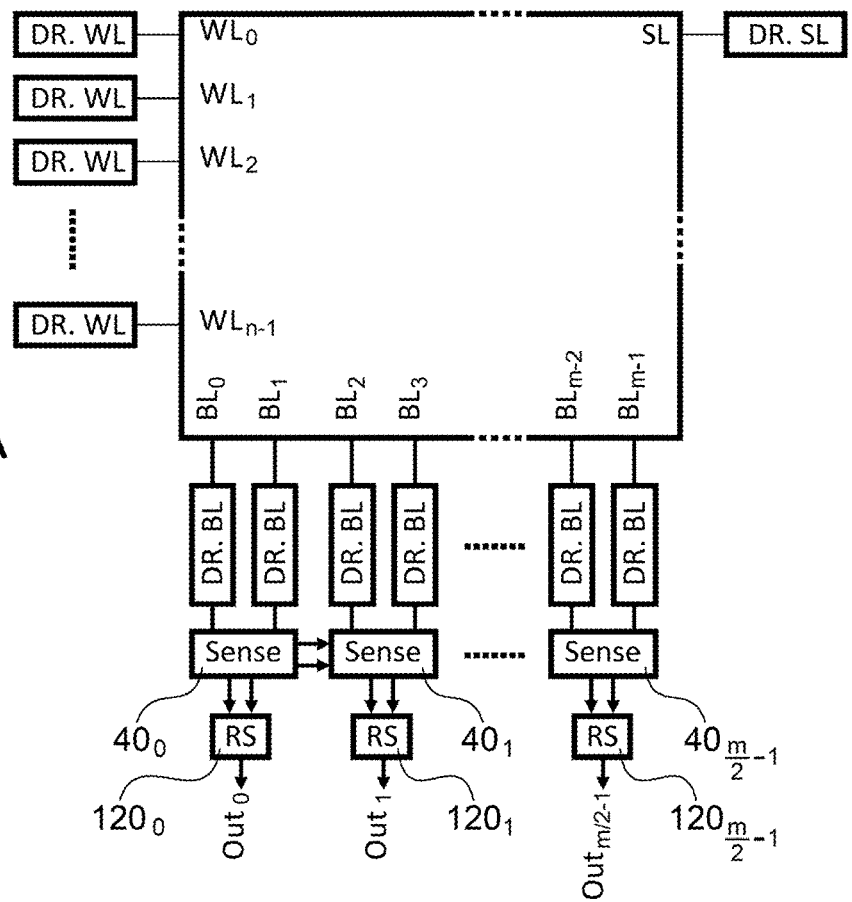
FIG. 16A is used to illustrate a particular embodiment wherein a memory element is provided as output of the latch sense amplifier in order to store an output data of this latch sense amplifier before a reset of the amplifier is carried out.

In the example illustrated in FIG. 16A, the memory elements $120_0, \ldots, 120_{(m/2)-1}$ are provided at the base of the column and each connected to the outputs OutA and OutB of the sense amplifiers $40_0, \ldots, 40_{(m/2)-1}$. Thus, the results of a reading remain in memory in these flip-flops until the next reading, or rather until the next reset of the nodes N1 and N2 performed prior to any reading. Such flip-flops RS have the advantage of being able to be formed with the aid of a reduced number, for example 8 transistors, which makes it possible to limit the increase of surface occupied by the read circuit.

Figure 16B:
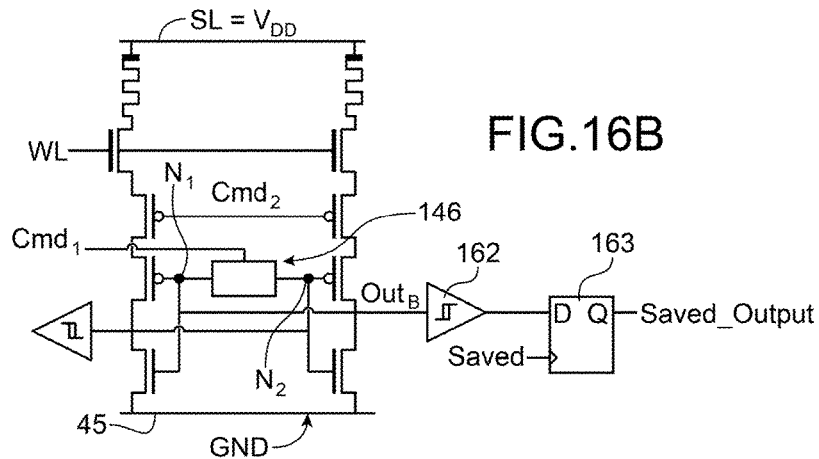
FIG. 16B is used to illustrate another particular embodiment with a variant of memory element provided as output of the latch sense amplifier when the latter is equipped with a reset switch between its read nodes.

One alternative embodiment, illustrated in FIG. 16B, may be adapted to a device as described above in relation to FIG. 13, in other words when the reset is carried out by means of a switch 136 arranged between the read nodes $N_1$, $N_2$. The memory element 120 provided as output of the sense amplifier $44_0$ to make it possible to store the state of one of the outputs, here for example the output $Out_B$ corresponding to the node $N_1$ is this time equipped with a flip-flop 163 of the D type. Such a flip-flop delivers as output a Saved_ouput signal corresponding to binary data reproducing that as output OutB of the read circuit at each low-to-high transition of a SAVE signal for triggering storage.

Typically, the D flip-flop 163 is preceded by a Schmitt flip-flop 162 also called "Schmitt trigger" to make it possible to perform a formatting of the output signal and produce the interfacing with a logic portion.

According to a particular embodiment, it may be envisaged, at the end of the read operation, to help to recharge the bit lines BL0 and BL1 and thereby to make it possible to sequence the readings more rapidly, by injecting an additional current into the bit lines.

Figure 17:
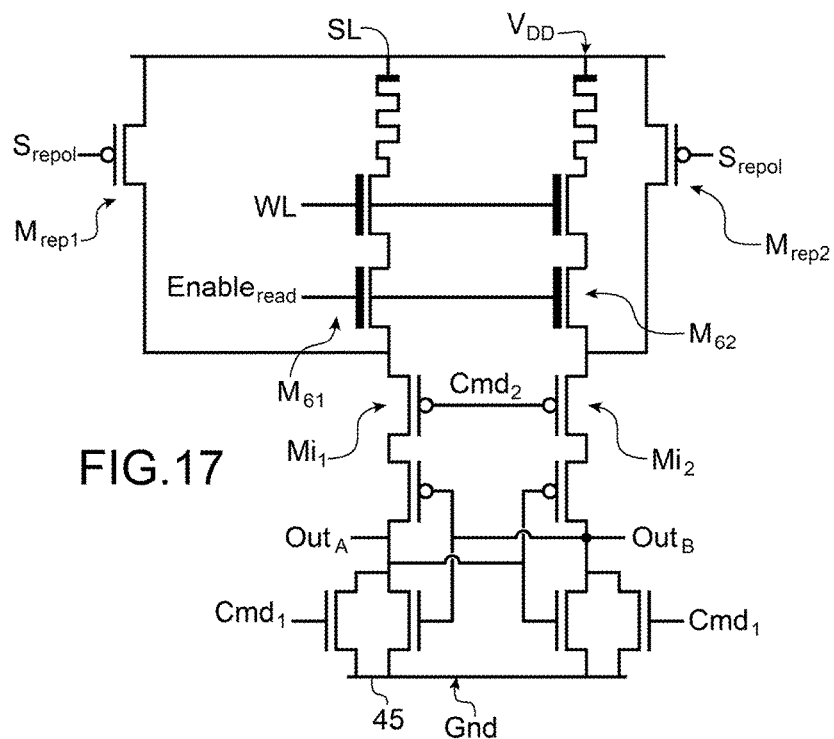
FIG. 17 is used to illustrate a ReRAM memory device according to a particular embodiment and equipped with means for repolarising bit lines.

Thus, in the example of embodiment illustrated in FIG. 17, the memory device is provided with a first transistor $Mrep_1$, and with a second so-called "repolarisation" transistor $Mrep_2$ and, each provided with an electrode connected to a polarisation line, in particular to the source line SL which, in this example, is a high supply line set at the supply voltage Vdd, and with another electrode coupled to the bit lines, at the first isolation transistor $Mi_1$ in the case of the first repolarisation transistor $Mrep_1$ and at the second isolation transistor $Mi_2$ in the case of the second repolarisation transistor $Mrep_2$.

In this particular example of embodiment, these repolarisation transistors $Mrep_1$, $Mrep_2$ are not connected directly to the bit lines but here to the separation transistors $M_{61}$, $M_{62}$ typically having a gate dielectric thicker than that of the transistors of the read circuit in order to protect the latter. Such a configuration makes it possible to prevent having to produce repolarisation transistors with thick gates.

The enabling of repolarisation transistors $Mrep_1$, $Mrep_2$ is performed during the comparison phase, on the end of the comparison phase, with the aid of a repolarisation control signal $S_{repol}$ applied on their gate. This enabling is triggered some time after the change of state of the first control signal $Cmd_1$ of the reset transistors $Mrz_1$, $Mrz_2$ stopping the reset. If an example of embodiment is taken such as described in relation to FIG. 8 where the bit lines BL are fully recharged in 4 ns, these repolarisation control transistors are triggered in less than 4 ns after the start of the read operation, but after a minimum time ensuring not to interfere with the evaluation operation taking place during the comparison phase until toggling of the amplifier.

A memory device in accordance with the invention is not necessarily limited to an arrangement of memory cells as described above in relation to FIG. 1.

Thus, in order to particularly limit the consumption related to the discharge of the capacitance of the bit lines, an alternative arrangement may be implemented wherein the 2T-2R cell is "returned" in relation to the arrangement described above. Indeed, according to the resistive memory technology used, it is possible that the electrodes of a resistive memory are less capacitive than the sources of the selection transistors, inducing a lower total bit line capacitance.

Figure 18:
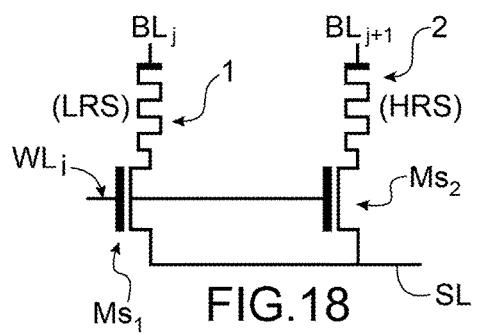
FIG. 18 is used to illustrate a variant for arranging a ReRAM memory cell likely to be integrated into a ReRAM memory array in accordance with the invention.

In the example of embodiment illustrated in FIG. 18, higher electrodes of the resistive elements 1, 2 form or are connected respectively to a first bit line $BL_i$ and a second bit line $BL_{i+1}$. For this variant, an electrode of the selection transistors $Ms_1$, $Ms_2$, in the example illustrated their source forms or is connected to the source line SL. With such an arrangement, the saving of the source capacitances of the selection transistors $Ms_1$, $Ms_2$ is thus made to only discharge and recharge the parasitic capacitance of access to physically smaller and generally less capacitive resistive elements.

A memory device in accordance with the invention may be further provided to perform logic operations, in particular IMC (In Memory Computing) or NMC (Near Memory Computing) memory operations.

Thus, an operation may be particularly carried out between a volatile binary data coming from an element external to the memory array and at least one non-volatile data stored in the RRAM memory. Such a functionality may be incorporated into the proposed read circuit.

Figure 19:
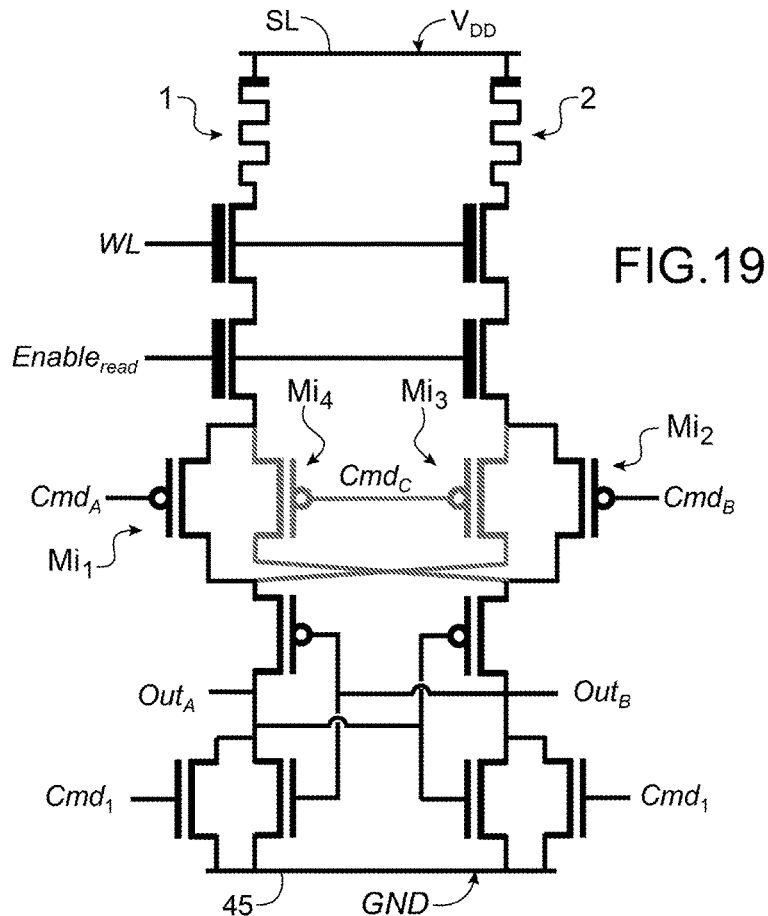
FIG. 19 is used to illustrate a read circuit for ReRAM memory provided with an additional pair of isolation transistors in order to carry out logic operations, in particular logic operations of the XOR or NXOR type between a non-volatile data stored in the ReRAM memory and another data, in particular a volatile data.

In the example of embodiment illustrated in FIG. 19, an additional pair of isolation transistors $Mi_3$, $Mi_4$ is provided for this, in order to be able to perform logic operations: in particular of the XOR type, or of the AND type, or of the OR type between at least one "non-volatile" data stored in the RRAM memory and a so-called "volatile" data coming from an element external to the memory array. A third isolation transistor $Mi_3$ and a fourth isolation transistor $Mi_4$ cross-connected are thus provided. These isolation transistors $Mi_3$, $Mi_4$ are arranged so that the third isolation transistor $Mi_3$ has a first electrode coupled to the first isolation transistor $Mi_1$ and a second electrode coupled to the second isolation transistor $Mi_2$ and so that the fourth isolation transistor $Mi_4$ has a first electrode coupled to the second isolation transistor $Mi_2$ and a second electrode coupled to the first isolation transistor $Mi_1$. For this variant, the first isolation transistor $Mi_1$, the second isolation transistor $Mi_2$ are controlled respectively by a signal $Cmd_A$ and by another signal $Cmd_B$, called "drive signals" applied respectively on their gate, whereas the third isolation transistor $Mi_3$ and the fourth isolation transistor $Mi_4$ are controlled by the same drive signal $Cmd_C$.

When a simple read operation is carried out, the signals $Cmd_A$, $Cm_B$ are identical and adopt one or other of the sequences described above of the control signal $Cmd_2$. The signal $Cmd_C$ applied on the gate of the isolation transistors $Mi_3$ and $Mi_4$ may be in this case placed constantly in a state so as to lock the isolation transistors $Mi_3$ and $Mi_4$.

When a logic operation is carried out, the signals $Cmd_A$, $Cmd_B$, $Cmd_C$ may depend on the value of the volatile logic data $Data_{VOL}$ with which the operation is carried out. For example, if this volatile logic data $Data_{VOL}$ equals '1', the isolation transistors $Mi_1$, $Mi_2$ are enabled (i.e. placed in a conducting state) by disabling (i.e. placing them in an OFF state) the isolation transistors $Mi_3$, $Mi_4$. In this case, if a volatile logic data '0' is processed, the crossed pair $Mi_3$, $Mi_4$ is enabled, while disabling (i.e. placing them in an OFF state) the isolation transistors $Mi_1$, $Mi_2$.

To apply an XOR function, the drive signals $Cmd_A$ and $Cmd_B$ are provided as for a normal reading, so as to enable the isolation transistors $Mi_1$, $Mi_2$ whereas the isolation transistors $Mi_3$, $Mi_4$ are disabled when the volatile data $Data_{VOL}$ is $Data_{VOL}$='0'. When $Data_{VOL}$='1', the signal $Cmd_C$ is provided in such a way as to enable the crossed pair $Mi_3$, $Mi_4$, whereas the isolation transistors $Mi_1$, $Mi_2$ are disabled.

The device is not limited to the implementation of an XOR or NXOR function and may also make it possible to implement other logic functions, in particular an OR function and/or an AND function as well as their complementaries.

For the operations of the AND or OR type, depending on the value of the volatile data $Data_{VOL}$, the result is either directly equal to the value of the non-volatile data $Data_{NON-VOL}$, or independent of the non-volatile data $Data_{NON\_VOL}$.

Consequently, a suitable driving of the signals $Cmd_A$ and $Cmd_B$ may make it possible to bias the reading in the cases where the result is independent of $Data_{NON\_VOL}$.

With a device as illustrated in FIG. 19, the execution of logic operations of the OR and AND type may be performed with the aid of isolation transistors $Mi_1$, $Mi_2$, without using the crossed pair $Mi_3$, $Mi_4$. The drive signal $Cmd_C$ is in this case provided so as to disable (i.e. rendered OFF) the additional isolation transistors $Mi_3$, $Mi_4$.

Figure 20:
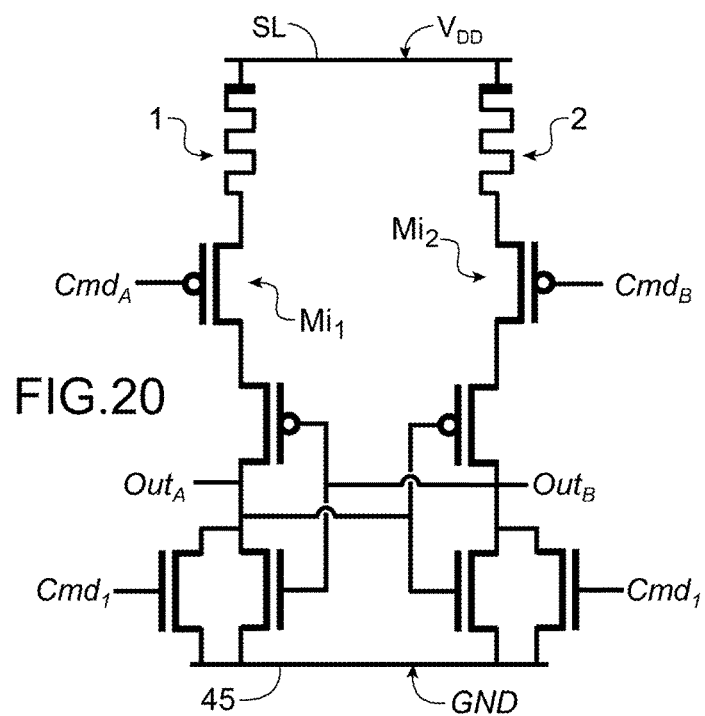
FIG. 20 is used to illustrate a circuit for reading ReRAM memory configured to implement, or a normal reading of logic operations, in particular logic operations of the XOR or OR or AND type without an additional pair of isolation transistors.

If it is desired to only perform operations of the OR and type (or complementaries), it is therefore possible alternatively to provide a read circuit as in FIG. 20, with the isolation transistors $Mi_1$, $Mi_2$, without the additional crossed pair of isolation transistors.

In one case, for example, where the implementation of OR and functions is provided, with a device wherein a logic '1' stored in an elementary cell is coded by forcing the first resistive element 1 to LRS and the second resistive element 2 to HRS: when an OR logic function is implemented only the first isolation transistor $Mi_1$ is enabled by way of the signal $Cmd_A$.

In this case, to carry out an AND function only the second isolation transistor $Mi_2$ is enabled by way of the signal $Cmd_B$.

Thus, at the generation of signals $Cmd_A$, $Cmd_B$, $Cmd_C$, these signals depend on whether the operation carried out is a simple read operation or on the chosen logic operation, as well as on the value of a volatile binary data $Data_{VOL}$ that is used as an operand.

Figure 21:
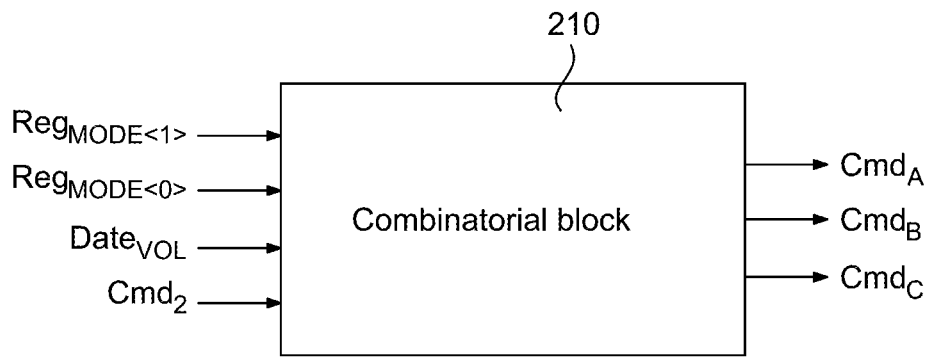
FIG. 21 is used to illustrate a control logic block for switching the read circuit between a simple read operating mode and at least one operating mode in memory computation operation for which this read circuit is likely to contribute to the implementation of one or more logic operations.

With a device as illustrated for example in FIG. 19, it is possible to find 4 different operating modes of the read circuit:

a "normal" read mode,
a mode wherein a first logic operation is carried out, in particular an XOR operation,
a mode wherein a second logic operation is carried out, in particular an AND operation,
and a mode wherein a third logic operation is carried out, in particular an OR operation, The control circuit that produces the drive signals $Cmd_A$, $Cmd_B$, $Cmd_C$ may be provided with a digital control block 210, as illustrated in FIG. 21, which may be formed of a set of logic gates and which, depending on its inputs RegMODE<1>, RegMODE<0>, $Data_{VOL}$, makes it possible to carry out a selection between the various aforementioned selection modes.

To code four different operating modes, it is possible to use two input bits: RegMODE<1>, and RegMODE<0> of the digital block 210, as in the table given below.

| Mode | REG$_{MODE<1>}$ | REG$_{MODE<0>}$ |
|---|---|---|
| Simple read | 0 | 0 |
| XOR | 0 | 1 |
| AND | 1 | 0 |
| OR | 1 | 1 |

The drive signals $Cmd_A$, $Cmd_B$, $Cmd_C$ may be produced from the control signal $Cmd_2$ the evolution of which may be as described above. It should be reminded that in the case of a simple reading, we typically have the drive signals $Cmd_A$ and $Cmd_B$ identical to the control signal $Cmd_2$.

The way of encoding a data in a cell, the output of the sense amplifier $44_0$ observed when a reading or an operation is carried out from that with OutB connected to the first node $N_1$ and that with OutA connected to the second node $N_2$, the way of selecting a given logic operation are the choice of the Person Skilled in the Art and may be different from those described above.

A control block 210 for producing the drive signals $Cmd_A$, $Cmd_B$, $Cmd_C$ of the isolation transistors $Mi_1$, $Mi_2$ may be associated with means as described above to make it possible to produce the control signal $Cmd_1$ of the reset transistors $Mrz_1$, $Mrz_2$.

Figure 22:
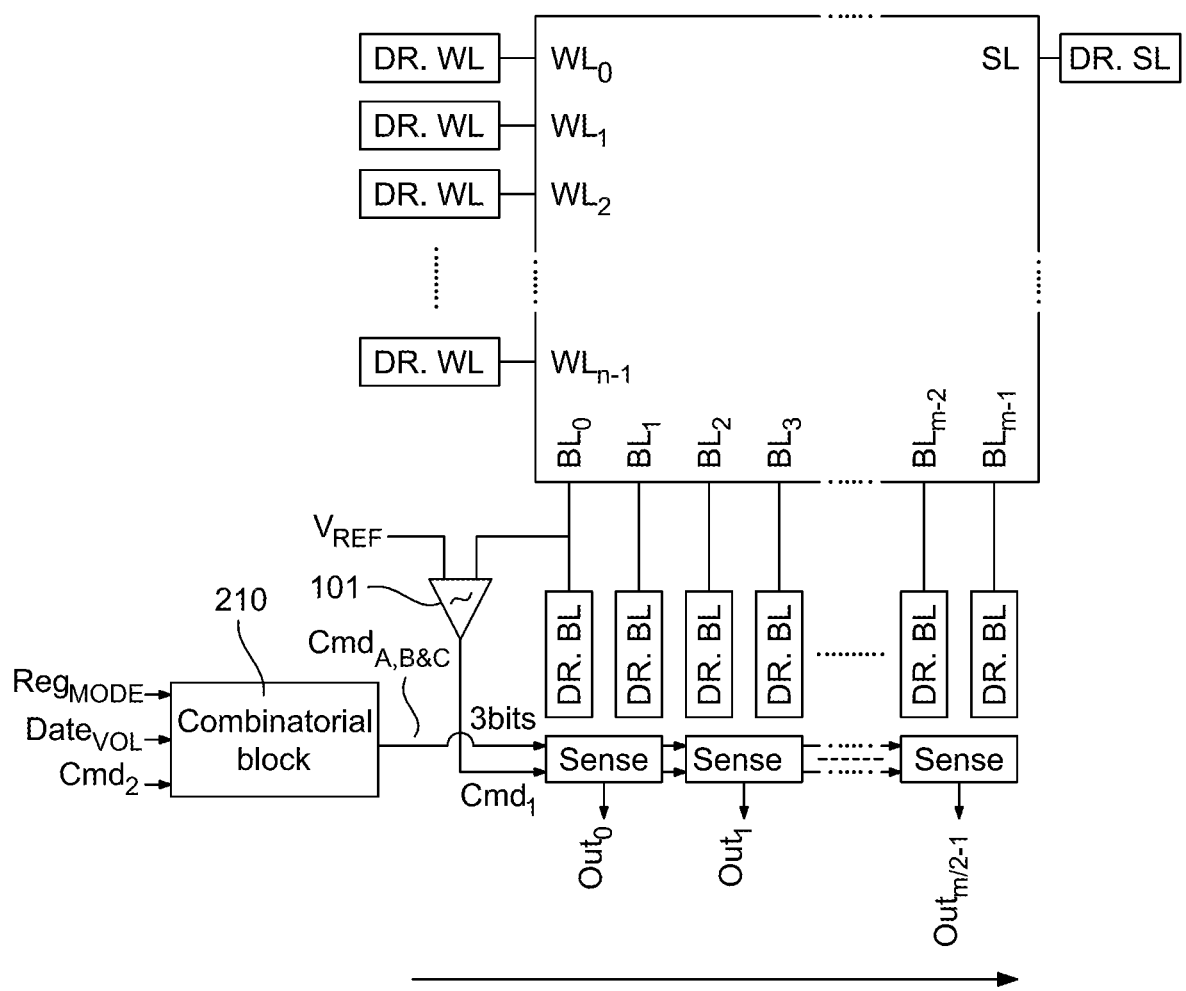
FIG. 22 is used to illustrate a memory device equipped with a control block for driving the sequence of at least one signal for controlling isolation transistors and a means for driving the sequence of the control signal of a reset stage.

Thus, in the example of embodiment of FIG. 22, the selection block 210 is integrated into a control circuit provided with the comparator 101 producing as output the first control signal $Cmd_1$.

Figure 23:
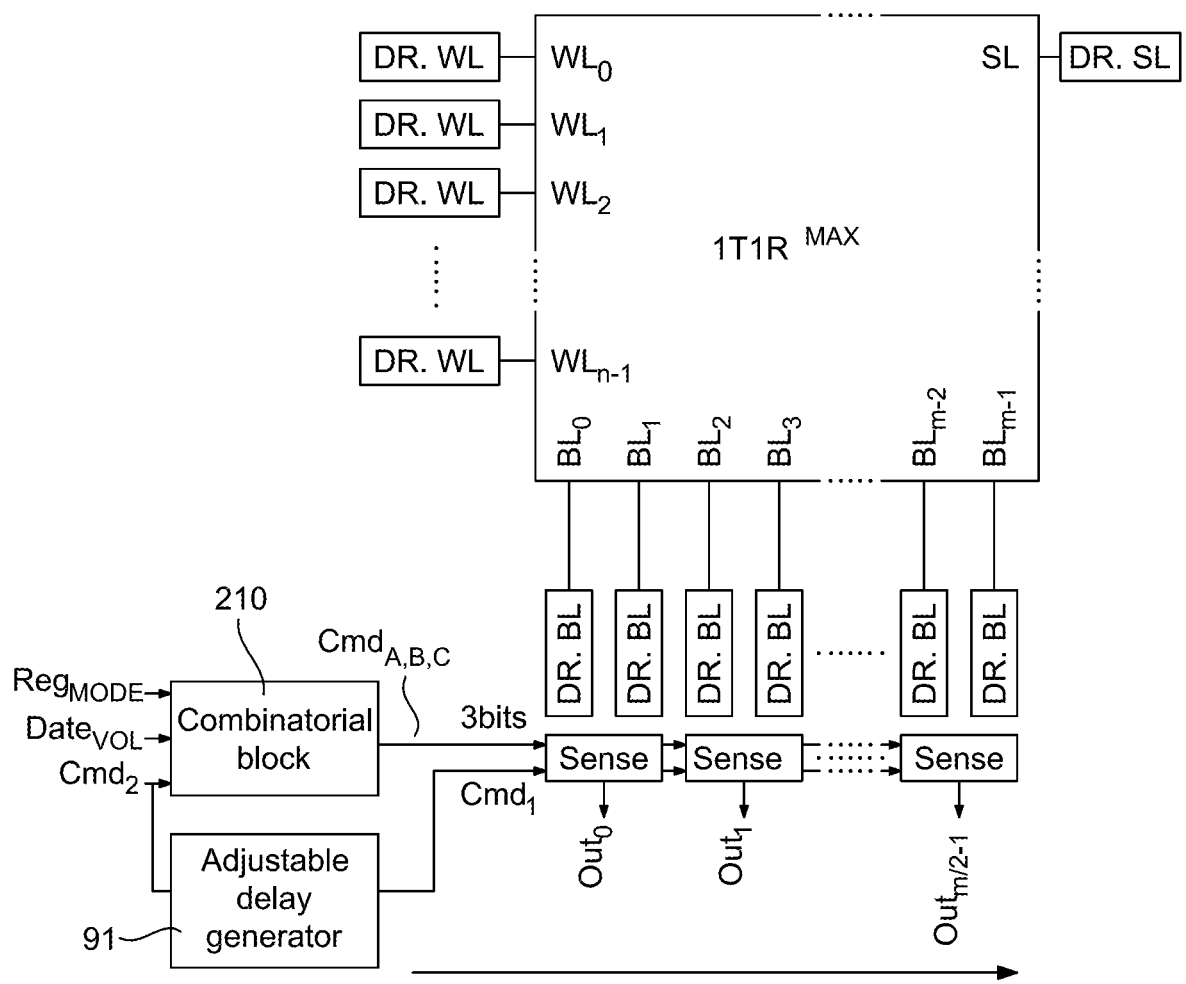
FIG. 23 is used to illustrate a memory device equipped with a control block for driving the sequence of the control signal for driving the sequence of at least one signal for controlling isolation transistors and another means for driving the sequence of the control signal of a reset stage.

In the alternative embodiment of FIG. 23, the selection block 210 is this time associated with the adjustable delay generator 91 that produces the first control signal $Cmd_1$ from the second control signal $Cmd_2$.

An example of truth table of the selection block 210 is given below, with various states of signals $Cmd_A$, $Cmd_B$, $Cmd_C$ to make it possible to drive respectively the gate of the first isolation transistor $Mi_1$, the gate of the second isolation transistor $Mi_2$, and the respective gates of the additional pair of isolation transistors $Mi_3$, $Mi_4$.

| Mode | $REG_{MODE<1>}$ | $REG_{MODE<0>}$ | $Data_{VOL}$ | $Cmd_A$ | $Cmd_C$ | $Cmd_B$ | Read type |
|---|---|---|---|---|---|---|---|
| Simple read | 0 | 0 | 0 | '1' | '0' | '1' | Normal |
| | | | 1 | '1' | '0' | '1' | Normal |
| XOR | 0 | 1 | 0 | '1' | '0' | '1' | Normal |
| | | | 1 | '0' | '1' | '0' | Reversed |
| AND | 1 | 0 | 0 | '0' | '0' | '1' | Force '0' |
| | | | 1 | '1' | '0' | '1' | Normal |
| OR | 1 | 1 | 0 | '1' | '0' | '1' | Normal |
| | | | 1 | '1' | '0' | '0' | Force '1' |

Figure 24:
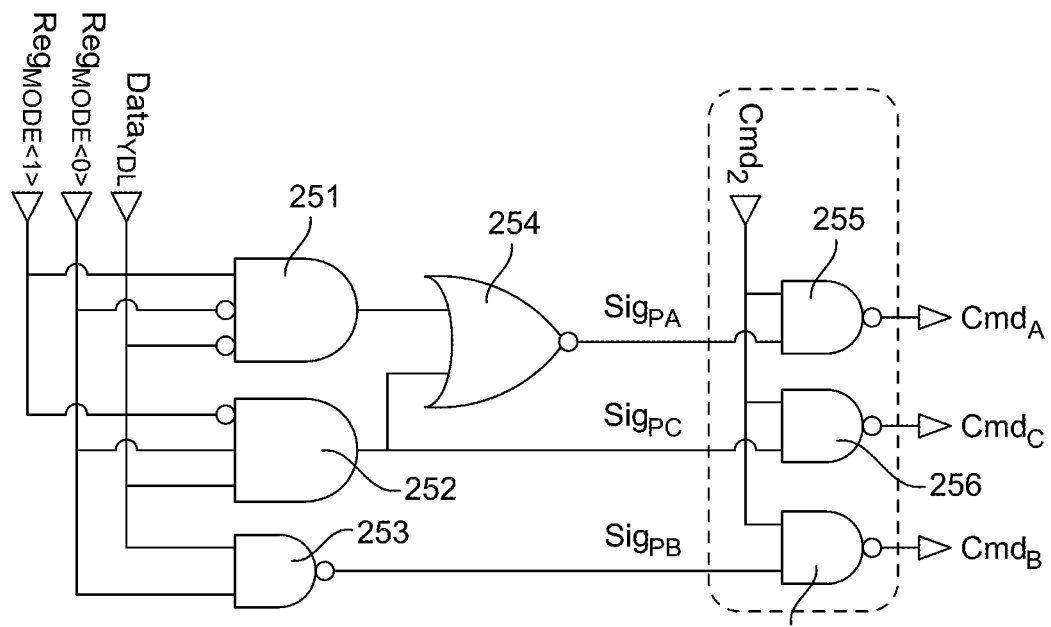
FIG. 24 is used to illustrate an example of embodiment of a digital control block for producing various signals for controlling the isolation transistors of the read circuit according to an operating mode selected for this circuit.

A selection block 210 responding to such a truth table may be implemented for example with the aid of an arrangement of logic gates 251, 252, 253, 254, 255, 256, 257, such as given by way of example in FIG. 24.

A memory device as described above may be applied particularly in the implementation of neuron network systems for which it is desired to limit as far as possible the consumption and wherein the read memory accesses are numerous and non-stop.

In such systems, the RRAM memory cells may make it possible to store a synaptic weight. In this case, the memory may be read by carrying out a read access on a complete row of cells, in particular on a line (horizontal row) of cells.

Figure 25:
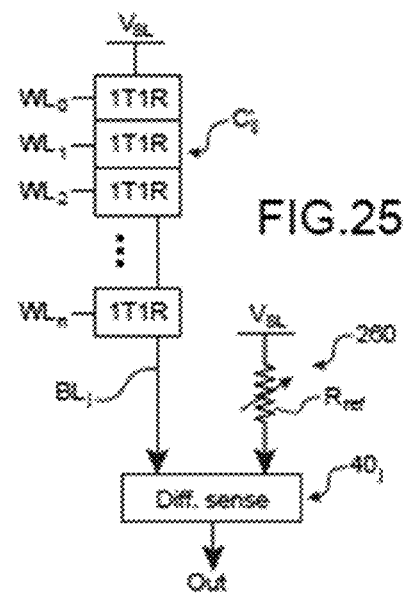
FIG. 25 is used to illustrate an example of embodiment of the ReRAM memory device with 1T-1R cells.

As a variant of one or other of the examples of embodiments described above, it is possible, by replacing cells of the 2T-2R type, to provide an array with cells of the so-called "1T-1R" type wherein the stored value is kept this time with the aid of a single resistive element of variable resistivity between two LRS and HRS resistivity levels, this resistive element having an electrode coupled to a selection transistor. In such elementary cells, the selection transistor is also controlled by a signal SWL conveyed by a word line $WL_i$, thus making it possible, alternately to couple or uncouple the resistive element to/from a bit line BLj. The bit line BLj+1 is, as illustrated in the example of embodiment of FIG. 25, typically common to the cells $C'_{ij}$ of the same vertical row or column of cells and the array counts, in this particular example of embodiment, only one bit line per vertical row or column.

Around the periphery of the array, and in particular at the base of each column, a read circuit $40_j$ is then provided to make it possible to translate into a binary data the resistive state of the resistive element of a memory cell. The read circuit $40_j$ of a column of cells may have a structure as described above but here is associated with a single bit line $BL_i$ and with a reference line 260 provided with a resistance $R_{ref}$ in order to be able to determine a current difference between the current circulating on the bit line and a reference current circulating on the reference line 260 and to thus evaluate whether the resistive element stores a value corresponding to a HRS state or another value corresponding to a LRS state.

It will be noted that the reference line is in this example constructed and polarised in a similar manner to a 1T1R memory cell when the memory cell is selected for reading. Thus, the reference resistance Rref is in this example connected to an identical supply line by sharing for example the same source line. It is possible for example to provide a reference resistance Rref per column, positioned opposite or close to the amplifier 40j (therefore right at the top or right at the bottom of the array) and connected to the amplifier 40j by a reference bit line.

The read operations performed with this reference line are a differential reading that may be performed in a similar manner to the examples of operations described above. The only difference resides in the fact that the reference resistance Rref will have a resistivity value that will not be the HRS or LRS value corresponding to the one that may be taken by a memory cell, but an intermediate value between these two values. Thus, this embodiment with "single" memory cells of the 1T1R type may in practice be used when the difference between the HRS and LRS values is sufficient. In other words, it is necessary to make sure that the variation range of possible HRS resistance values and that of possible LRS resistance values (due to technological dispersions, to the temperature) are not only not overlapping, but sufficiently spaced apart to be able to envisage using a reference resistance of which the variation range of values must be situated between the two other HRS and LRS ranges. If reference is made to an arrangement with isolation transistors as described above, it may thus be envisaged to couple the first bit line $BL_{i-1}$ to the first isolation transistor $Mi_1$ whereas the reference line 260 is coupled to the second isolation transistor $Mi_2$. Likewise, the person skilled in the art will know how to adapt all of the embodiments of a read circuit presented with 2T2R memory cells to the use of a single bit line connected to a selected 1T1R memory cell and of a reference line 260 with the resistance Rref.

Advantageously, although the 1T1R memory cells may be programmed with more than two resistance values, for example, 3, 4, or even more, then this example of embodiment with a reference line and a differential reading makes it possible to advantageously read multivalued memory cells. To this end, the reference resistance $R_{ref}$, may be a variable resistance. It is then possible to determine the stored value by way of successive readings. The value of the resistance Rref may thus be modified from one read operation to the other in order to be able to determine a plurality of current differences between the current circulating on the bit line and a reference current circulating on the reference line 260 and find through successive tests which is the value stored in the resistive cell.

According to one alternative embodiment of the reference line, it comprises a current source produced other than with a reference resistance connected to the source line SL. Thus, it is possible to use for example a current mirror the value of which may be changed easily according to known production techniques.

In one or other of the examples that have been described above, an isolation stage is provided, in particular equipped with two isolation transistors $Mi_1$, $Mi_2$ to alternately couple and uncouple the bit line(s) to/from the sense amplifier $44_0$ in order, during a waiting phase between two reads, to be able to limit the static consumption, and furthermore to be able to anticipate the reset operation if necessary.

Figure 26:
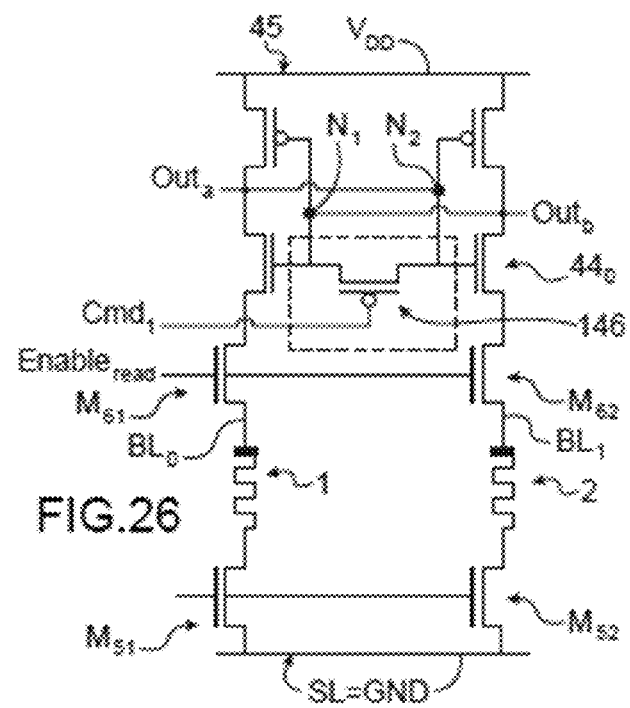
FIG. 26 is used to illustrate an alternative embodiment without isolation transistor and for which in the sense amplifier a reset switch is arranged between the read nodes.

One alternative embodiment without isolation transistor is this time illustrated in FIG. 26 where the sense amplifier $44_0$ is connected to the separation transistors $M_{61}$, $M_{62}$. These separation transistors $M_{61}$, $M_{62}$ are constantly conducting during successive read operations, by way of an $Enable_{read}$ signal maintained active between two reads and constantly non-conducting during write operations. Thus, during write operations the $Enable_{read}$ signal is in a state different from that which it is in during read operations. In this example, the reset stage $46_0$ is formed of a switch transistor 146, arranged between the first node $N_1$ and the second node $N_2$ for reading the sense amplifier $44_0$.

In this example of embodiment, the sense amplifier $44_0$ is connected to a high supply line 45 i.e. set at VDD, whereas the cells are connected to the source line SL this time forming a low supply line i.e. connected to the ground GND.

Figure 27A:
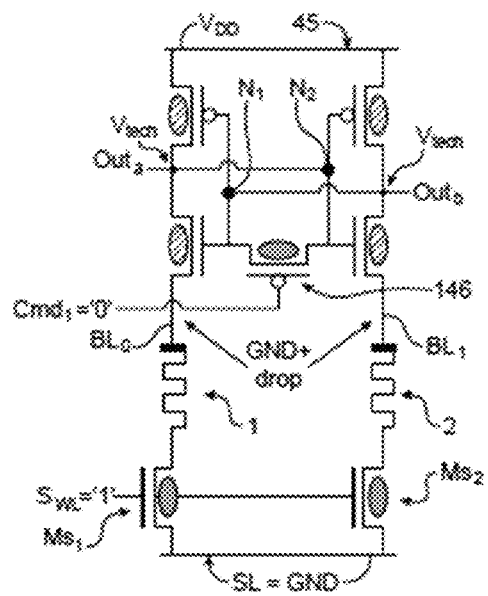
FIGS. 27A, 27, 27C are used to illustrate various operating phases of this alternative embodiment during a read operation.
Figure 27B:
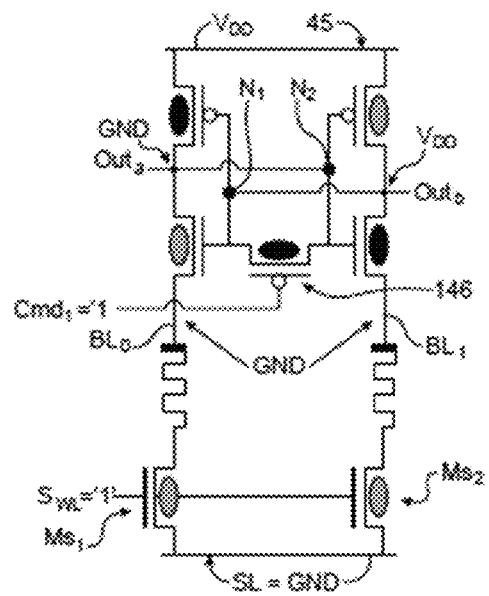

A read operation in a plurality of phases and in accordance with this variant of arrangement is illustrated in FIGS. 27A and 27B. In the interest of simplification, the separation transistors are not shown in these figures insofar as they remain constantly enabled so long as read accesses are performed on the array.

The control signals of the various operating phases are this time the control signal $Cmd_1$ applied on the gate of the switch transistor 146 and the signal SWL from the word line WL and applied on the gate of the selection transistor(s) $Ms_1$, $Ms_2$. According to a so-called "partial discharge" phase (illustrated in FIG. 27A), the selection transistors $Ms_1$, $Ms_2$ are enabled, for example by way of a signal SWL in a state '1' when they are of the NMOS type, whereas the switch transistor 146 is also enabled by way of the signal $Cmd_1$='0' when this transistor is of the PMOS type.

The bit lines $BL_0$, $BL_1$ are coupled, by means of resistive elements, to the source line SL here connected to the ground. During this partial discharge phase, the bit lines $BL_0$, $BL_1$ see their potentials slightly increase progressively, but the read nodes $N_1$ and $N_2$ are maintained connected to one another. A reset is then carried out in order to avoid switching the sense amplifier $44_0$ due to the partial discharge currents of the bit lines, as explained above.

According to a so-called "comparison" phase (illustrated in FIG. 27B), the selection transistors $Ms_1$, $Ms_2$, are maintained enabled, SWL being maintained in the same state (in this example SWL='1'), the switch transistor 146 is this time rendered OFF ($Cmd_1$='1') so as to disconnect the nodes $N_1$, $N_2$ from one another to make it possible for their respective potentials to evolve independently of one another. The sense amplifier $44_0$ then has to be toggled and the read result can be obtained, once this toggling of the amplifier has been performed.

When the sense amplifier $44_0$ has toggled and it is in a latched state, it has a state of high impedance at the bit lines $BL_0$, $BL_1$ that are consequently returned to the ground by means of transient currents through the memory cell, low currents insofar as the bit lines are not very far away from the ground potential during the partial discharge step. Once the potential of the bit lines corresponds to that of the ground, there is almost no more current that circulates neither in the memory cell, nor in the amplifier. Thus, it is possible to desire to maintain this almost-zero consumption state until a next read operation. This state corresponds to a waiting state between two successive readings.

Figure 27C:
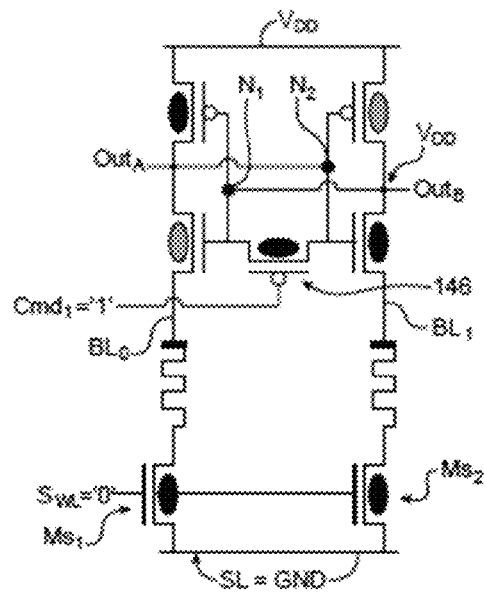

Thus, the device is subsequently placed in a so-called "transition" phase (FIG. 27C). This transition phase is implemented when it is desired to read the cells of the different horizontal rows and thus successively enable two different word lines WL. During this transition phase, the word line WL is disabled (control signal SWL='0') and makes it possible to uncouple the cell and consequently the bit lines from the source line SL, whereas the switch transistor 146 remains disabled (i.e. OFF with $Cmd_1$='1'). During this "transition" phase, the amplifier $44_0$ is no longer supplied and does not result in current consumption. The nodes of the amplifier connected to the bit lines $BL_0$, $BL_1$ are then floating but without current circulation possible their respective potentials are maintained.

When another read operation is carried out on a new cell of another line, another word line is then enabled (control signal SWL='1') and this makes it possible to couple the new cell and consequently the bit lines to the source line SL making it possible to find a waiting state similar to that shown in FIG. 27A. This transition phase is in fact the continuity of the waiting phase insofar as the read amplifier 440 is inactive (no operation of reset, or of comparison).

Figure 28:
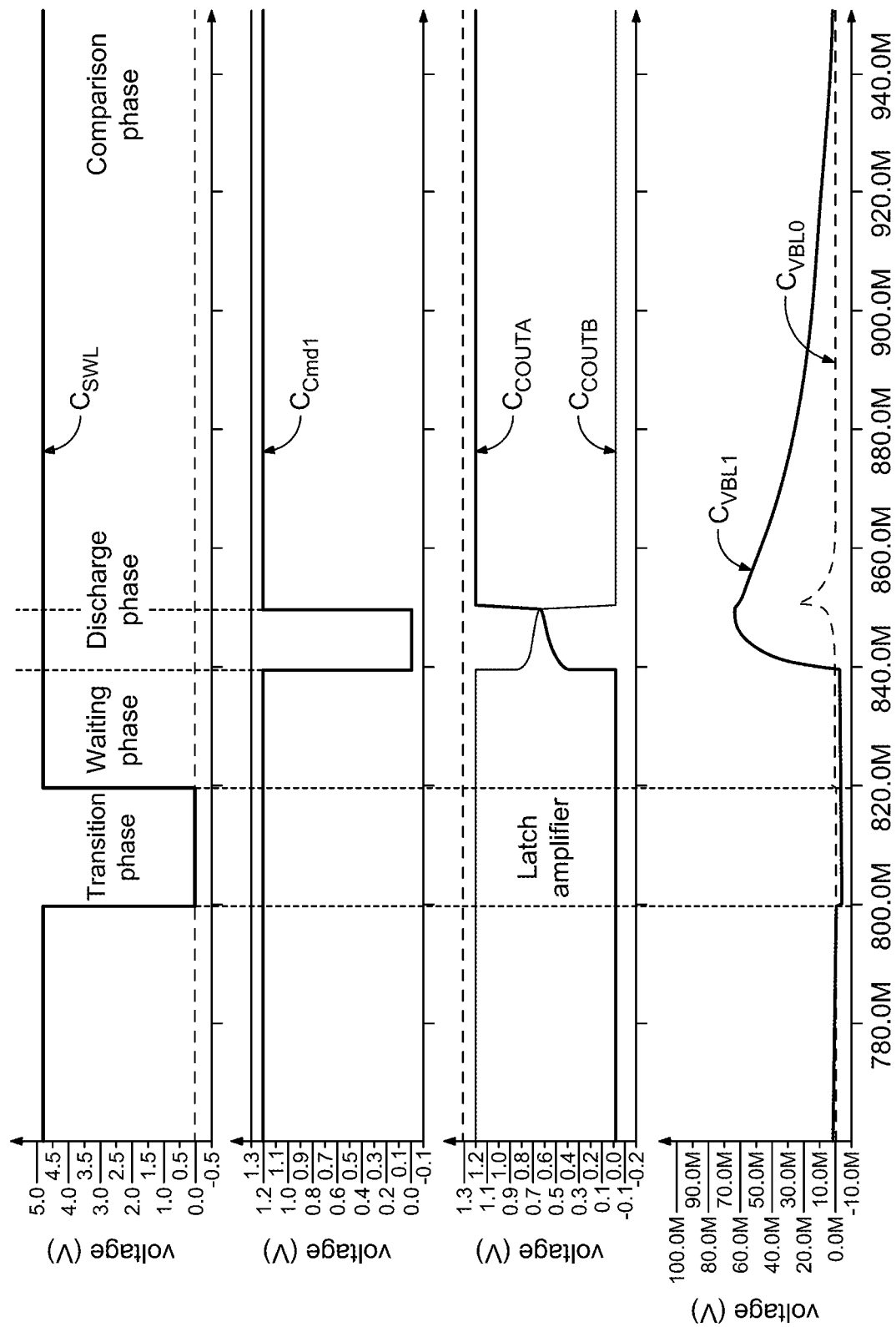
FIG. 28 is used to illustrate the evolution of signals particularly signals for controlling the various operating phases of this alternative embodiment.

The various waiting (with or without transition phase), partial discharge, comparison phases, likely to be implemented with a read circuit as described above in relation to FIG. 26, are shown in FIG. 28.

In this figure the evolution curve CSWL gives the evolution of the signal SWL applied on the word line and for alternately disabling the selection transistors during the transition phase then enabling the selection transistors during the waiting, discharge and comparison phases. It will be noted that in the interest of simplification, in this figure and that presented previously, a single signal CSWL is shown for potentially a plurality of word lines successively enabled.

The curve $C_{cmd1}$, is representative of the control signal $Cmd_1$ of the reset switch, alternately for uncoupling from one another the read nodes $N_1$, $N_2$ during the phase of transition then of waiting, then coupling the read nodes $N_1$, $N_2$ during the partial discharge phase and uncoupling them again during the comparison phase. The curves $Cv_{BL0}$, $Cv_{BL1}$ are used to illustrate respectively a voltage on the first bit line $BL_0$, a voltage on the second bit line $BL_1$, whereas the curves CoutA, CoutB give the evolution of the respective potentials of the nodes $N_2$, $N_1$.

It is observed that the comparison phase consists of a very short toggling phase during which the outputs of the amplifier toggle on one side or the other depending on the resistivity differences, then of a longer phase for recharging the bit lines. This recharge phase in fact resembles a waiting phase before a new partial discharge operation. Thus, generally "waiting phase" refers to any phase during which the bit lines no longer convey significant current between the memory cells and the amplifier $44_0$, as opposed to that occurring during a partial discharge phase and the start of the comparison until the toggling of the amplifier. Such a waiting phase may include a so-called transition phase in the case where the following reading is performed on another line. In the case where isolation transistors are provided, it is possible during a waiting phase to perform an operation for resetting the amplifier 440. The choice of whether or not to perform a reset operation during a waiting phase among other things depends on the type of reset circuit chosen, on the presence or not of an element of the flip-flop type (D or RS or other).

The curves of FIG. 28 were obtained with examples of circuits as shown in FIG. 27 for which no isolation transistor is used. It can be seen that it is quite possible to reset the amplifier during the partial discharge phase, without needing a prior waiting phase with reset. Furthermore, the isolation transistors are not essential for ensuring that no unnecessary static current circulates during waiting phases.

It is possible to sequence read operations strictly speaking comprising a partial discharge phase with reset, then a comparison phase having a minimum duration ensuring the toggling of the amplifier regardless of the dispersions of the resistivity values of the memory cells. The phase for recharging line bits at the end of the comparison phase may be relatively short and it is not essential to achieve the complete recharging of bit lines before triggering a new pre-discharge phase for a new reading. The use of repolarisation transistors for performing an active polarisation of bit lines $BL_0$, $BL_1$ has been described above in connection with FIG. 17. It is also possible to provide such transistors with a device as described above in relation to FIG. 26.

Figure 29:
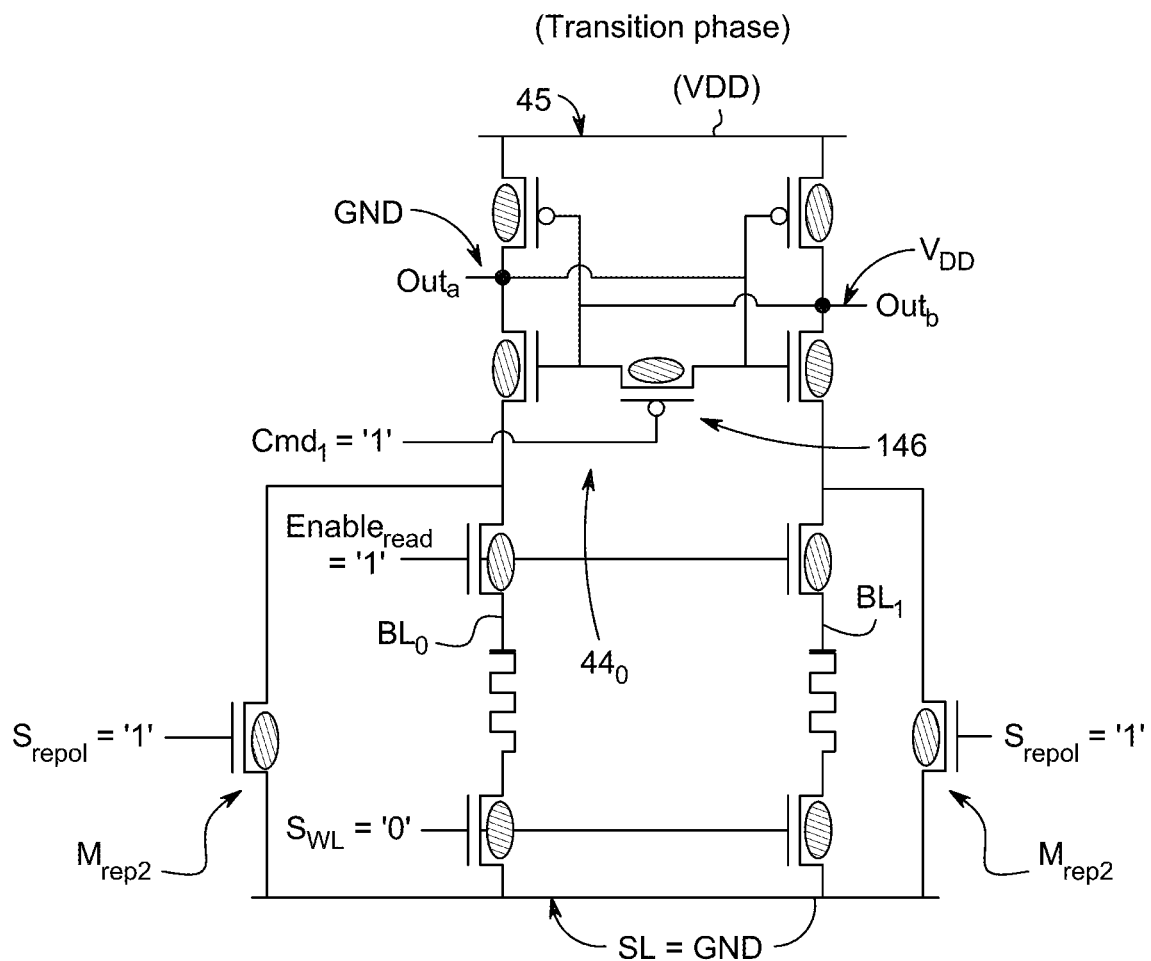
FIG. 29 is used to illustrate a particular embodiment of this variant with means for repolarising the bit lines.

Thus, in FIG. 29, the memory device is provided with a first "repolarisation" transistor $M'rep_1$, and with a second "repolarisation" transistor $M'rep_2$ and, each provided with an electrode connected to a supply line, in particular to the source line SL that, in this example, is a low supply line connected to the ground GND, and with another electrode coupled to the sense amplifier $44_0$.

In this particular example of embodiment, the enabling of the repolarisation transistors $M'rep_1$, $M'rep_2$ is performed during the transition phase with the aid of a repolarisation control signal $S_{repol}$ applied on their gate to couple the bit lines to the source line and thus connect them to the ground GND. The repolarisation transistors $M'rep_1$, $M'rep_2$ may also be enabled in a second stage of the comparison phase, after a first stage reserved for performing the toggling of the amplifier. Thus, for example, it is possible to provide an end of toggling sense system for enabling the repolarisation transistors to accelerate the recharging of the bit lines to the voltage level of the source line, in order for example to be able to sequence more rapidly a new read cycle with a new phase of partial discharge and of comparison. Likewise, the repolarisation transistors are enabled during a transition phase and make it possible to maintain a supply of the latch amplifier during a transition phase as described above. By supplying the latch amplifier it is ensured here to maintain the bit lines at the potential of the source line SL, here at the ground. Furthermore, during this transition phase, all or part of the phase for recharging the bit lines may be performed thanks to the repolarisation transistors. This also offers the possibility of implementing a waiting phase that does not need the enabling of a word line WL. According to a variant not shown, it is also possible to provide a set of additional transistors to perform the partial discharge phase of the bit lines other than through the separation transistors and the branches of the amplifier, by providing such additional transistors connecting the bit lines to the source line SL.

Thus generally, the partial discharge phase consists of partially discharging the bit lines by connecting the latter to the source line. Advantageously, it is used for this, the transistors already existing for other functions, such as the transistors of the branches of the amplifier, or the transistors used for the reset phase. However, it is possible to use transistors other than these.

A ReRAM memory device as described above may also be integrated into onboard systems of the Internet of Things (IoT) type or of the Cyber-Physical System (CPS) type.

The invention claimed is:

1. A resistive random access memory (ReRAM) device comprising:
    an array of memory cells each connected to a first supply line set at a first supply potential, each cell of said array being provided with at least one first resistive element of variable resistivity and in series with at least one first selection transistor,
    a read circuit associated with a column of cells of the array, the read circuit comprising:
    a sense amplifier of the latch type consisting of cross-connected inverters and equipped with a first read node and a second read node, said inverters respectively forming a first branch and a second branch each connected on one side to a second supply line set at a second supply potential, different from said first supply potential,
    at least one first coupling transistor connecting another side of said first branch to a first bit line coupled to the first respective resistive elements of the cells of said column,
    at least one second coupling transistor connecting another side of said second branch either to a second bit line coupled to the second resistive elements of the cells of said column, or to a reference line delivering a reference current;
    a circuit for controlling read operations on the array by way of signals for controlling switch elements, said control circuit being configured to, during a read operation carried out on a given cell of said column:
    according to a waiting phase, charge said first bit line to a potential equal or close or substantially equal to said first supply potential, then,
    according to a reset phase of said sense amplifier, by way of at least one reset transistor connect the first read node and the second read node, so as to equalise the potentials of the first read node and of the second read node;
    according to a partial discharge phase, connect the first bit line to the second supply line and when the device includes the second bit line connect the second bit line to the second supply line, so as to partially discharge said first bit line or said bit lines and obtain at the terminals of the cells of said column a non-zero difference of potentials while being lower, and in particular much lower, than a difference of potentials between the first supply potential and said second supply potential, the reset phase being triggered during the partial discharge phase; then
    according to a comparison phase, during which said first and second coupling transistors are rendered conducting, and said at least one reset transistor is rendered non-conducting, in order to make possible a circulation of a first current through said first branch of said sense amplifier, the first bit line and a first resistive element of said cell and a circulation of a second current through said second branch of said sense amplifier as well as either the reference line or the second bit line and a second resistive element of said cell, until a toggling of said sense amplifier according to a difference between said first and second currents.

2. The resistive random access memory device according to claim 1, wherein from said switch elements figures at least one first reset transistor belonging to a reset stage of said sense amplifier, and controlled by way of a first control signal, said control circuit being configured to:
during said reset phase, maintain conducting the first reset transistor, so as to interconnect the first read node and the second read node, or connect the first read node to the second supply line or connect a first terminal and a second terminal of the first inverter to the second supply line, and
during the comparison phase place the first control signal in a second state, different from said first state, so that said first reset transistor is non-conducting.

3. The resistive random access memory device according to claim 2, wherein said at least one first coupling transistor is or comprises a first isolation transistor arranged between said sense amplifier and said first bit line, said first isolation transistor being controlled by way of at least one second control signal, the control circuit being further configured to:
during the waiting phase, place said second control signal in a given state so as to render OFF the first isolation transistor and thus isolate the first bit line from said sense amplifier and place said first control signal in a state so as to maintain conducting the first reset transistor, said control circuit being further configured to during partial discharge and comparison phases: place said second control signal in another state, different from said given state, so as to render conducting the first isolation transistor and thus connect the first bit line to said sense amplifier.

4. The resistive random access memory device according to claim 3, wherein the memory cells are each provided with at least one second resistive element in series with a second selection transistor, said column of cells being coupled to said second bit line, said at least one second coupling transistor being or comprising a second isolation transistor between the sense amplifier and said second bit line, the second isolation transistor being controlled by way of said second control signal.

5. The resistive random access memory device according to claim 4, wherein the read circuit further comprises: a third isolation transistor and a fourth isolation transistor, the third isolation transistor and the fourth isolation transistor being cross-connected so that the third isolation transistor has a first electrode coupled to the first isolation transistor and a second electrode coupled to the second isolation transistor and so that the fourth isolation transistor has a first electrode coupled to the second isolation transistor and a second electrode coupled to the first isolation transistor.

6. The resistive random access memory device according to claim 4, able to carry out memory operations, in particular at least one logic operation, said control circuit being further provided with: a control logic block configured to produce drive signals of the respective gates of said isolation transistors according to at least one digital operating mode selection signal emitted over one or more inputs of said control logic block and of a volatile logic data as input of said control logic block, to select between a first operating mode of the read circuit corresponding to a read operation and at least one other operating mode of the read circuit corresponding to the implementation of at least one logic operation between at least one non-volatile data stored in the given cell of the given row of cells and the volatile logic data as input of said control logic block, said control logic block being configured to:
when the digital selection signal has a first value corresponding to a selection of a read operation: apply drive signals of the gate of the first isolation transistor and to the gate of the second isolation transistor corresponding to the second control signal,
when the digital selection signal has a value different from the first value and corresponding to a selection of a logic operation: transmit a first drive signal to the gate of the first isolation transistor and a second drive signal to the gate of the second isolation transistor, so as to block one of said first and second isolation transistors while rendering conducting the other of said first and second isolation transistors.

7. The resistive random access memory device according to claim 6, wherein the read circuit further comprises: a third isolation transistor and a fourth isolation transistor cross-connected, the control logic block being further configured to produce a drive signal of the respective gates of said third and fourth isolation transistors and wherein:
when said other value is a second value corresponding to a selection of a first logic operation, in particular of the OR type or of the AND type, the control logic block is configured so as to produce a first drive signal, a second drive signal different from the first drive signal, so as to render conducting the first isolation transistor while rendering OFF the second isolation transistor,
when said other value is a third value corresponding to a selection of a second logic operation, in particular of the AND type or of the OR type: transmit a first drive signal and a second drive signal so as to render OFF the first isolation transistor while rendering conducting the second isolation transistor,
when the digital selection signal has a fourth value corresponding to a selection of a third logic operation, in particular of the XOR type, said logic selection block is configured so as to transmit a first drive signal to the gate of the first isolation transistor and a second drive signal to the gate of the second isolation transistor identical to the first drive signal, the third drive signal being in a state different from that of the first drive signal and from the second drive signal.

8. The resistive random access memory device according to claim 2, comprising:
a first reset transistor coupled to the second node and to the second supply line, the first reset transistor having a gate controlled by the first control signal,
a second reset transistor coupled to the first node and to the second supply line, the second reset transistor having a gate controlled by the first control signal.

9. The resistive random access memory device according to claim 2, further comprising: a reset transistor having a gate controlled by the first control signal, the reset transistor being arranged between said first node and said second node.

10. The resistive random access memory device according to claim 1, wherein said read circuit is further provided, as output of said sense amplifier, with at least one memory storage element, configured to keep a data produced as output of said sense amplifier during said comparison phase after said toggling, said memory storage element being in particular provided with:
an RS flip-flop provided with an input coupled to the first read node and with another input coupled to the second read node, or a D flip-flop comprising an input coupled to the first read node or the second read node.

11. The resistive random access memory device according to claim 1, wherein during the partial discharge phase, the first bit line is connected to the second supply line by means of a first reset transistor rendered conducting by way of a first control signal, and by means of the first coupling transistor rendered conducting by way of a second control signal.

12. The resistive random access memory device according to claim 1, wherein during a waiting phase following a comparison phase of a preceding read operation, said sense amplifier is maintained in a latched state after its toggling, without reset, and wherein said first bit line recharges by a current passing through at least one selected cell of said column.

13. The resistive random access memory device according to claim 12, wherein the reset phase is performed only at the same time as the partial discharge phase.

14. The resistive random access memory device according to claim 1, wherein from said switch elements figures at least one switch element controlled by way of a first control signal and wherein said control circuit is further provided with a first comparator that receives a measured voltage of the first bit line, and produces as output the first control signal the state of which depends on a comparison carried out by said first comparator between said measured voltage and a predetermined reference voltage.

15. The resistive random access memory device according to claim 14, wherein said column is coupled to a first bit line and to a second bit line, and wherein the control circuit is provided with a second comparator that receives another measured voltage of said second bit line, the state of the first control signal further depending on a comparison carried out by said second comparator.

16. The resistive random access memory device according to claim 15, wherein the device further comprises:
at least one first so-called "repolarisation" transistor arranged between the first bit line and said first supply line, the first repolarisation transistor being configured to, according to a repolarisation drive signal applied on its gate, alternately couple the first supply line to the first bit line and uncouple the first supply line from the first bit line, said first repolarisation transistor being rendered conducting in a waiting phase and non-conducting during said partial discharge and comparison phases.

17. The resistive random access memory device according to claim 16, wherein said at least one first coupling transistor is or comprises a first separation transistor between the first bit line and the sense amplifier, the first separation transistor being controlled by an additional control signal called "read enable signal", the control circuit being configured to place said read enable signal in a state determined during said read operation so as to render conducting the first separation transistor, and place said read enable signal in another state, different from said determined state, during a write operation on the array so as to block the first separation transistor.

18. The resistive random access memory device according to claim 17, wherein said at least one first coupling transistor includes a transistor with a gate dielectric thicker than the gate dielectric of transistors constituting said sense amplifier.

* * * * *